(12) United States Patent
Sato et al.

(10) Patent No.: US 8,004,839 B2
(45) Date of Patent: Aug. 23, 2011

(54) COOLING SYSTEM FOR INFORMATION DEVICE

(75) Inventors: Yoichi Sato, Kawasaki (JP); Kenji Tosaka, Tokyo (JP); Mitsuo Hayashi, Tokyo (JP); Akihiro Yasuo, Kawasaki (JP); Hideki Kimura, Kawasaki (JP); Kengo Ueda, Kawasaki (JP); Katsuhiko Nakata, Kawasaki (JP); Yoshihisa Iwakiri, Kawasaki (JP); Hitoshi Nori, Kawasaki (JP); Tomoaki Haneda, Kawasaki (JP); Mika Tokumitsu, Kawasaki (JP); Naoki Shinjo, Kawasaki (JP); Kouji Kuroda, Kawasaki (JP); Yoshihiro Kusano, Kawasaki (JP)

(73) Assignees: Fujitsu Limited, Kawasaki (JP); Fuji Furukawa Engineering & Construction Co., Ltd., Kawasaki (JP)

( * ) Notice: Subject to any disclaimer, the term of this patent is extended or adjusted under 35 U.S.C. 154(b) by 149 days.

(21) Appl. No.: 12/040,037

(22) Filed: Feb. 29, 2008

(65) Prior Publication Data
US 2008/0232064 A1 Sep. 25, 2008

(30) Foreign Application Priority Data

Mar. 22, 2007 (JP) .................................. 2007-074810

(51) Int. Cl.
*H05K 7/20* (2006.01)
*G06F 1/20* (2006.01)

(52) U.S. Cl. ............... 361/696; 361/679.47; 361/679.48; 361/679.49; 361/679.53; 361/679.54; 361/695; 361/698; 361/699; 361/701; 361/703; 361/704; 165/104.33; 165/185; 454/184

(58) Field of Classification Search . 361/679.46–679.49, 679.51, 679.53–679.54, 361/690, 694–696, 698–699, 701, 703–704, 715–716, 720–721; 165/80.2–80.4, 104.33, 185; 454/184
See application file for complete search history.

(56) References Cited

U.S. PATENT DOCUMENTS
4,512,161 A * 4/1985 Logan et al. ................. 62/176.6
(Continued)

FOREIGN PATENT DOCUMENTS
JP    2002-374086 A    12/2002
(Continued)

OTHER PUBLICATIONS

Japan Inc APC Legendary Reliability Brochure, Modular and High Density Cooling, p. 2-11; 2006; 4th ed.
(Continued)

*Primary Examiner* — Robert J Hoffberg
(74) *Attorney, Agent, or Firm* — Westerman, Hattori, Daniels & Adrian, LLP

(57) ABSTRACT

To cool a blade type server disposed in an air-conditioned room, the following arrangements are made. The first is at least one shell having a ventilation passage disposed in the air-conditioned room. The second is, the following are disposed in a ventilation passage: racks, in which blade type servers each composed of a case with slim boards housed therein are stacked; cooling coils each having a coolant passage and a cooling fin and cooling a passing air; and at least one fan unit having axial-flow fans placed therein and producing air currents in one direction. The third is the fan unit forces a cooling air to flow in one direction in the ventilation passage thereby to cool the servers in the racks. The cooling coils and racks are disposed alternately so that warmed cooling air after passing through the rack is cooled by the cooling coil and then cools the next rack.

14 Claims, 24 Drawing Sheets

U.S. PATENT DOCUMENTS

| | | | |
|---|---|---|---|
| 5,121,291 A * | 6/1992 | Cope et al. | 361/695 |
| 6,222,729 B1 * | 4/2001 | Yoshikawa | 361/695 |
| 6,305,180 B1 * | 10/2001 | Miller et al. | 62/259.2 |
| 6,407,918 B1 * | 6/2002 | Edmunds et al. | 361/695 |
| 6,909,606 B2 | 6/2005 | Barsun et al. | |
| 6,972,952 B2 * | 12/2005 | Lee | 361/679.48 |
| 7,161,801 B2 * | 1/2007 | Chen et al. | 361/695 |
| 7,163,052 B2 * | 1/2007 | Taras et al. | 165/146 |
| 7,342,789 B2 * | 3/2008 | Hall et al. | 361/701 |
| 7,367,384 B2 * | 5/2008 | Madara et al. | 165/122 |
| 7,511,960 B2 * | 3/2009 | Hillis et al. | 361/702 |
| 7,551,971 B2 * | 6/2009 | Hillis | 700/90 |
| 7,854,652 B2 * | 12/2010 | Yates et al. | 454/184 |
| 7,856,838 B2 * | 12/2010 | Hillis et al. | 62/259.2 |
| 2004/0099747 A1 | 5/2004 | Johnson et al. | |
| 2005/0174733 A1 | 8/2005 | Novotny | |
| 2005/0268815 A1 * | 12/2005 | Creighton et al. | 105/404 |
| 2006/0260338 A1 * | 11/2006 | VanGilder et al. | 62/259.2 |
| 2007/0002536 A1 * | 1/2007 | Hall et al. | 361/695 |
| 2007/0064385 A1 * | 3/2007 | Paul et al. | 361/687 |
| 2008/0060372 A1 * | 3/2008 | Hillis et al. | 62/259.2 |
| 2009/0000774 A1 * | 1/2009 | MacDonald et al. | 165/122 |
| 2009/0122483 A1 * | 5/2009 | Hall | 361/688 |
| 2009/0207567 A1 * | 8/2009 | Campbell et al. | 361/696 |

FOREIGN PATENT DOCUMENTS

| | | |
|---|---|---|
| JP | 2004-055883 A | 2/2004 |
| JP | 2005-063434 A | 3/2005 |
| JP | 2006-301758 A | 11/2006 |
| TW | 267614 B | 12/2006 |

OTHER PUBLICATIONS

Communication dated Jan. 25, 2010 issued in corresponding European Patent Application No. 08003677.5-2214.

* cited by examiner

PORTION TO BE COOLED

PORTION TO BE COOLED

PORTION TO BE COOLED

PORTION TO BE COOLED

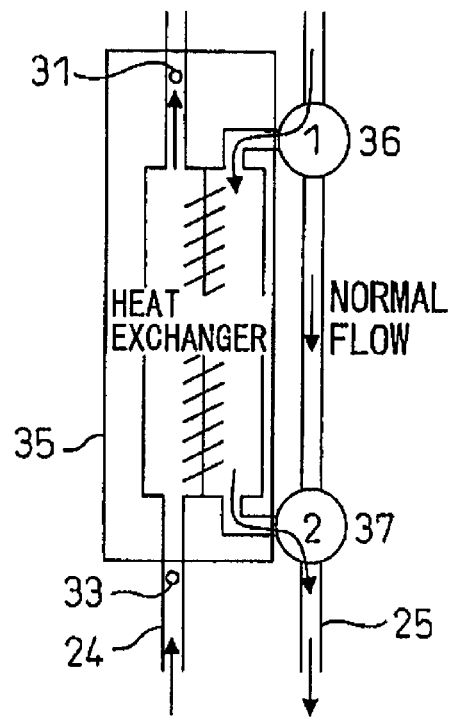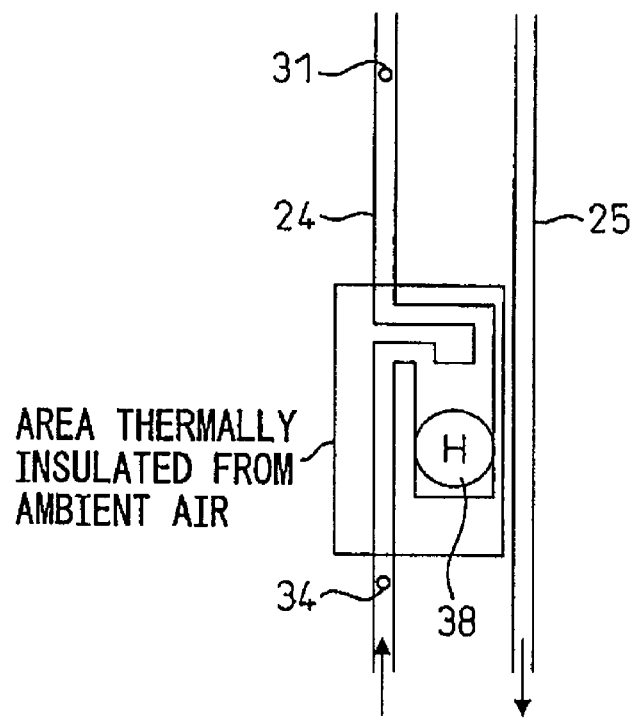

DIRECTION IN WHICH FAN IS INSERTED

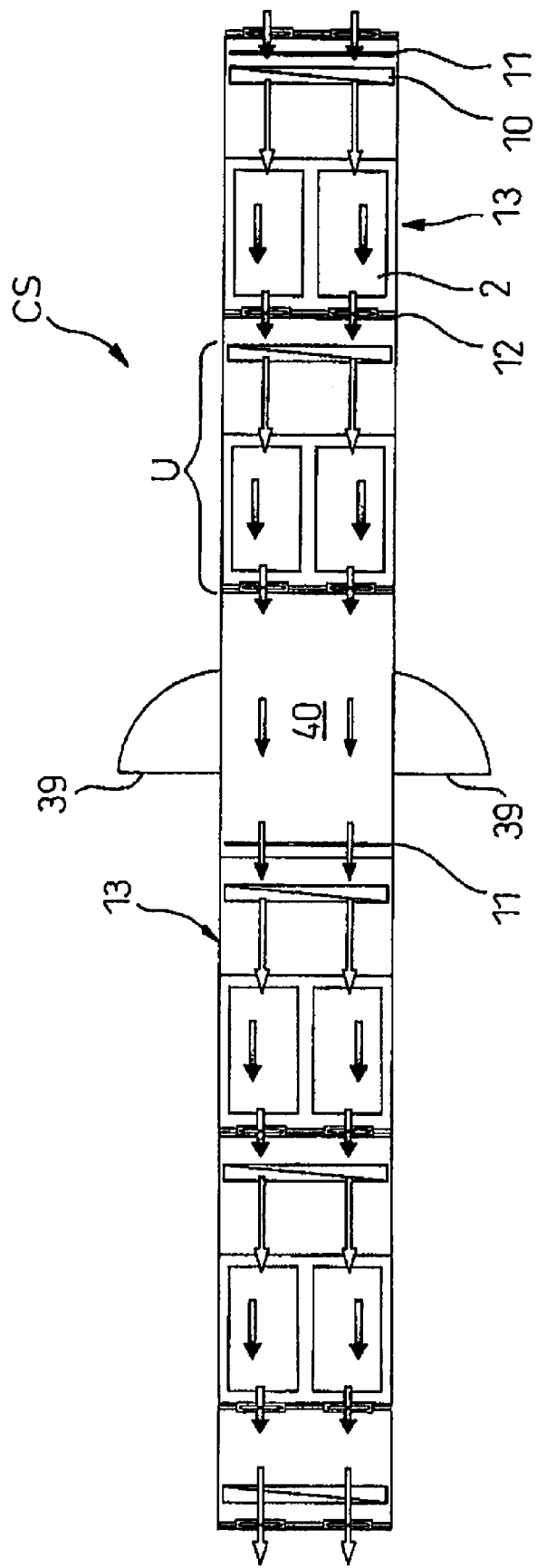

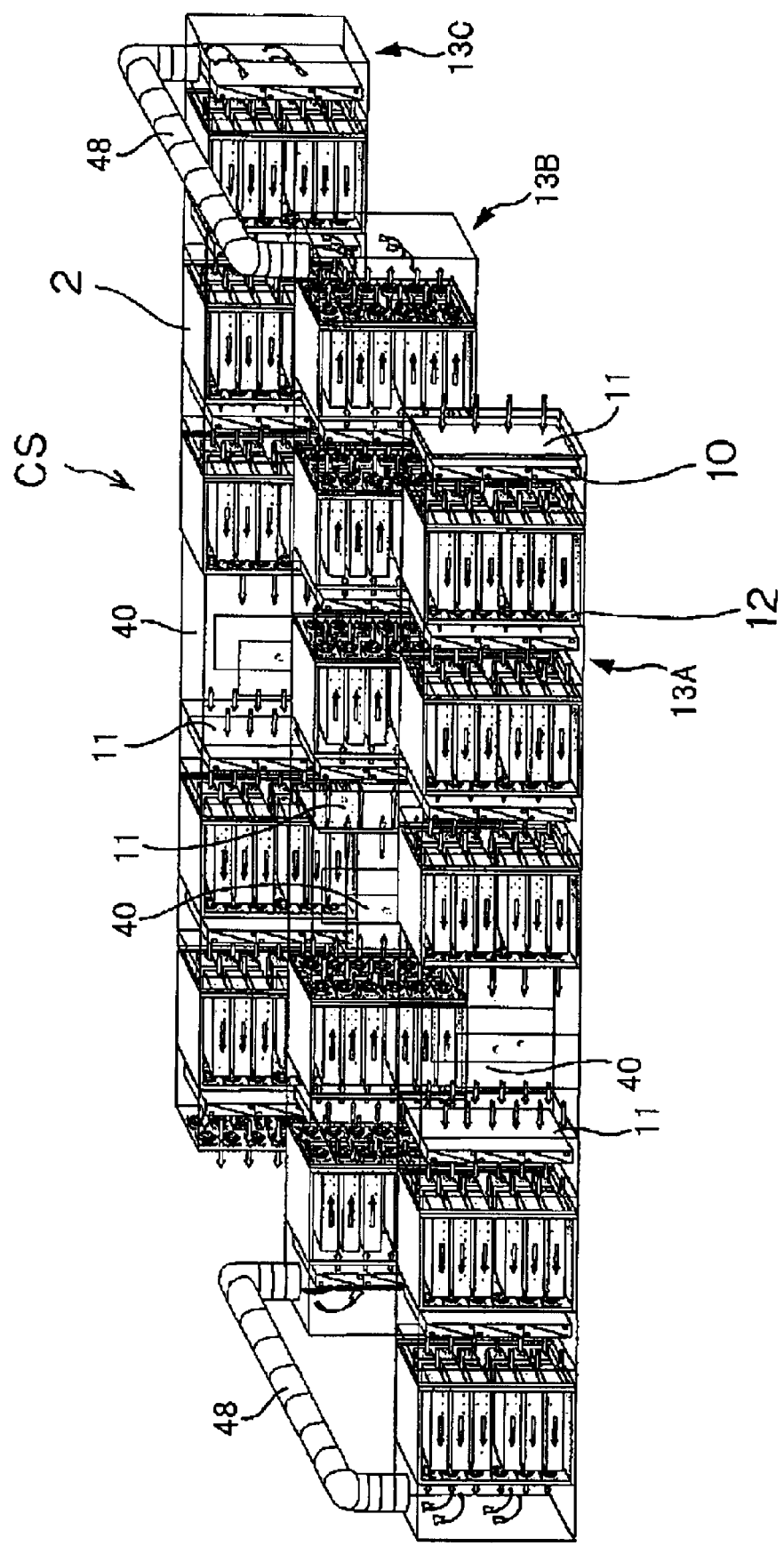

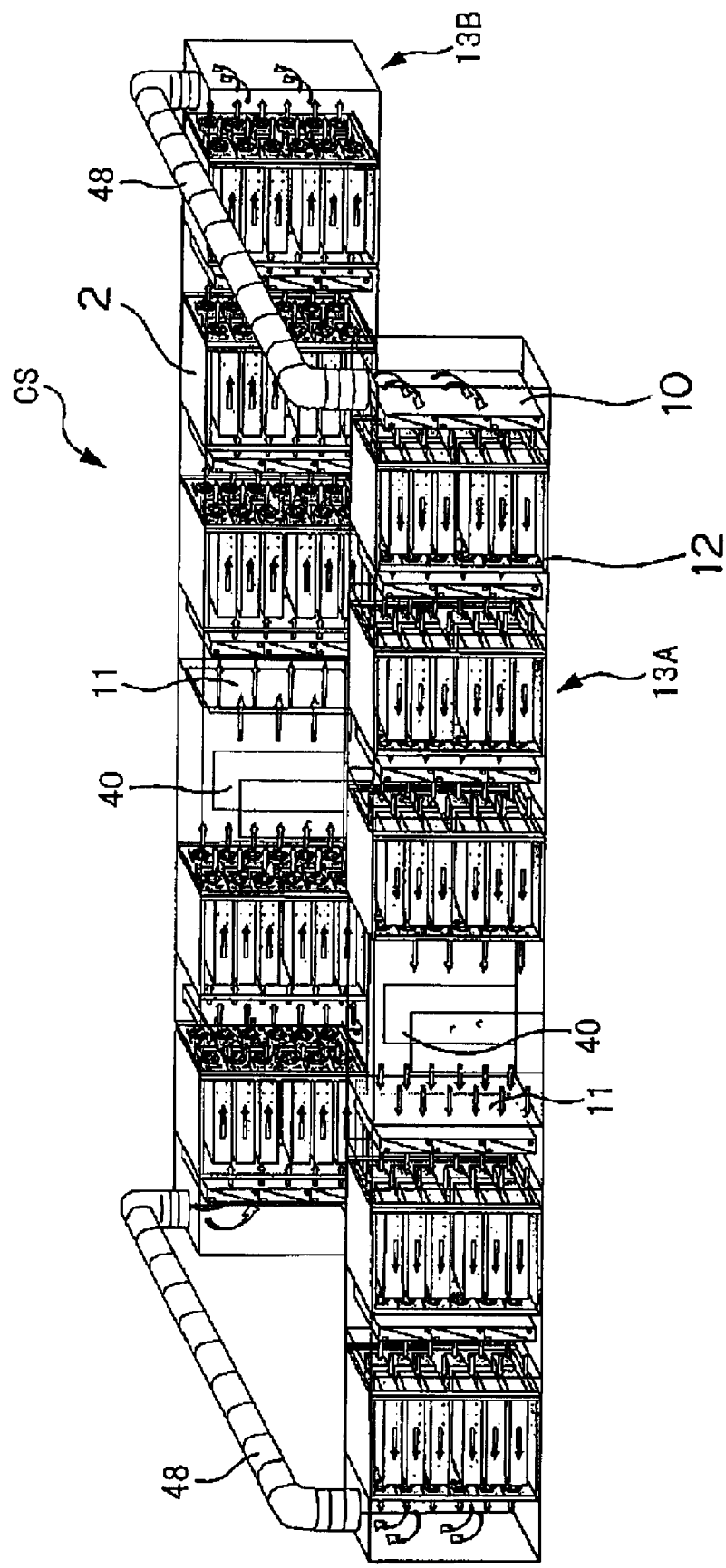

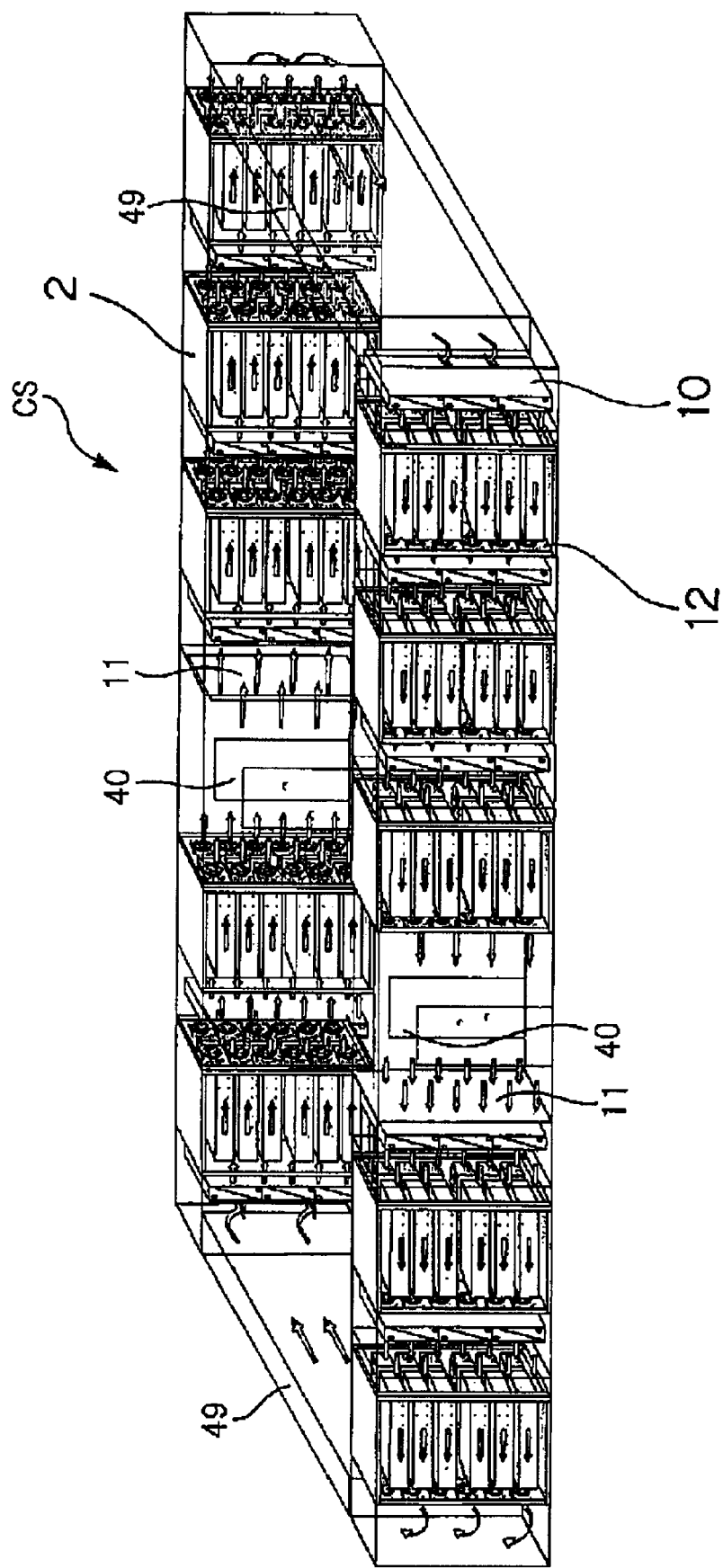

Fig.16A
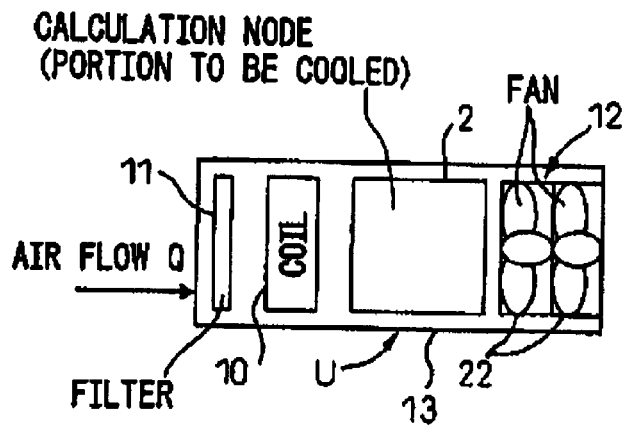
CALCULATION NODE
(PORTION TO BE COOLED)   FAN
AIR FLOW Q
FILTER
Fig.16B
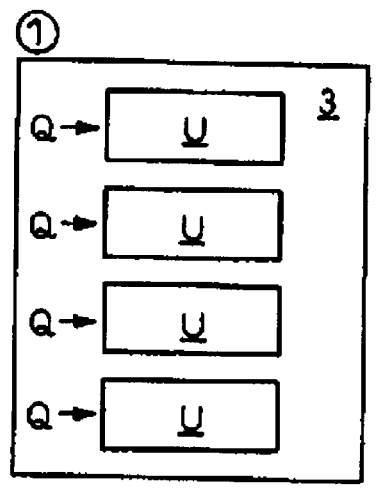
Fig.16C
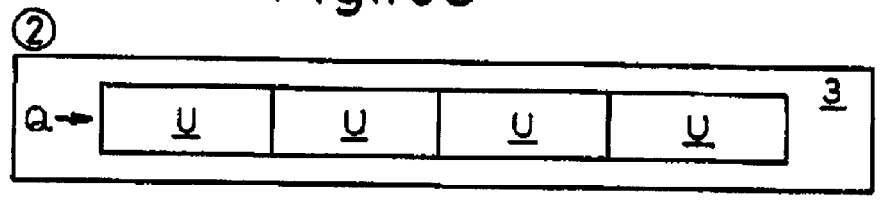
Fig.16D
| COMPARED IN | SYMBOL | ①PARALLEL | ②SERIES |
|---|---|---|---|
| NOISE | ») | LARGE | SMALL |
| AMOUNT OF DISCHARGE | Q | LARGE (4Q) | SMALL (Q) |
| FOOTPRINT | ▭ | LARGE | SMALL |
| LOAD OF COMPUTER ROOM'S AIR CONDITIONING | | LARGE | SMALL |
| RESULT OF JUDGMENT | | △ | ○ |
△ = moderate
○ = good

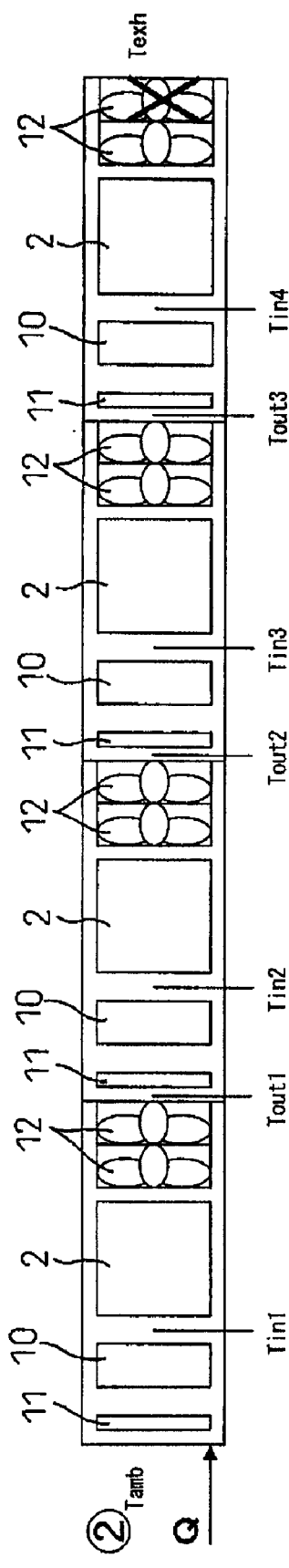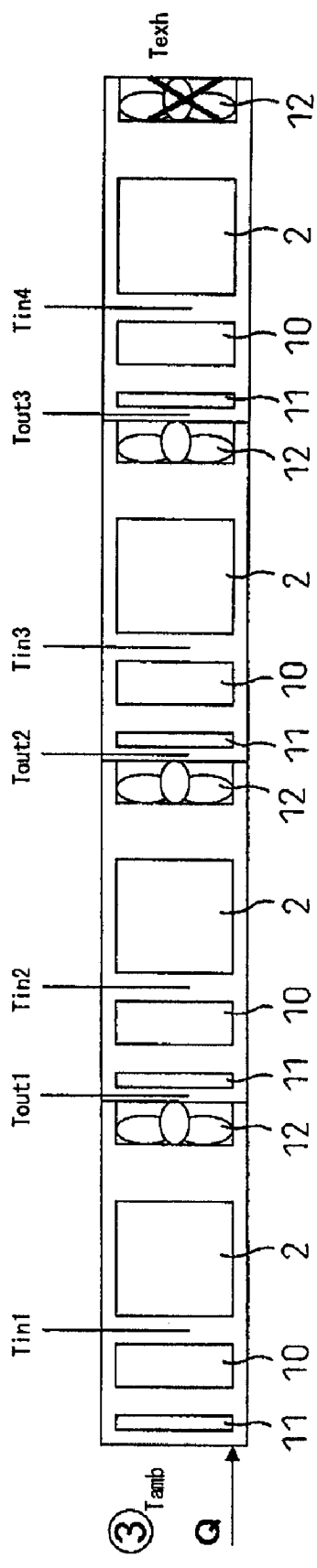

Fig.17D

| COMPARED IN | ① | ② | ③ |
|---|---|---|---|
| NUMBER OF EQUIPPED FANS | 8 | 8 | 4 |
| NUMBER OF POSSIBLE FANS AT FAULT | 4 | 4 | 1 |
| AMOUNT OF DISCHARGE | LARGE (4Q) | SMALL (Q) | MINIMUM (Q OR BELOW) |
| ELECTRIC POWER OF FAN (CARRYING POWER) | LARGE | LARGE | SMALL |
| DIFFERENCE OF THERMAL TREATMENT TEMPERATURE OF COLD-WATER COIL | SMALL | SMALL | LARGE |
| RESULT OF JUDGMENT | △ | ○ | ◎ |

△ = moderate
○ = good
◎ = excellent

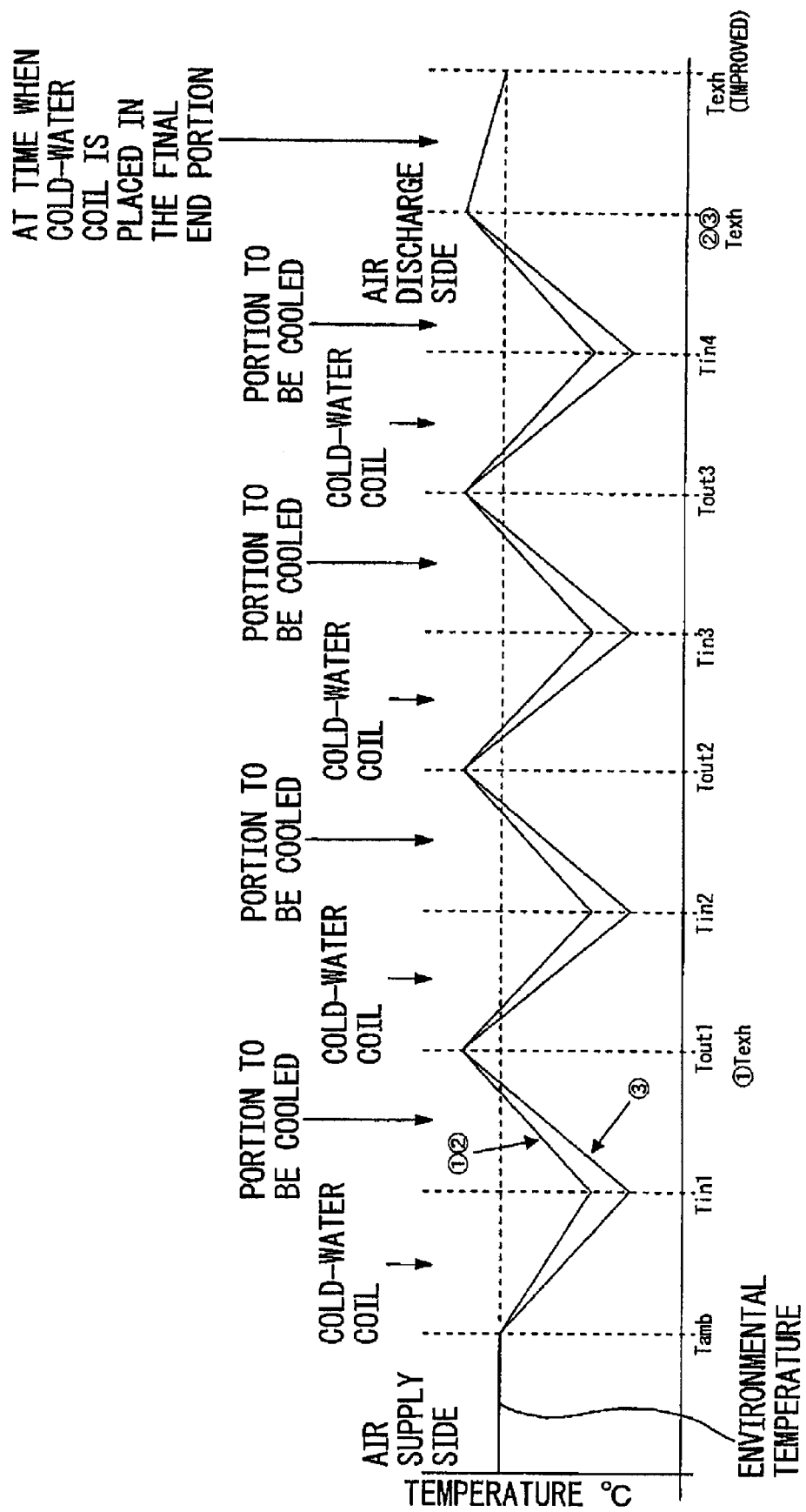

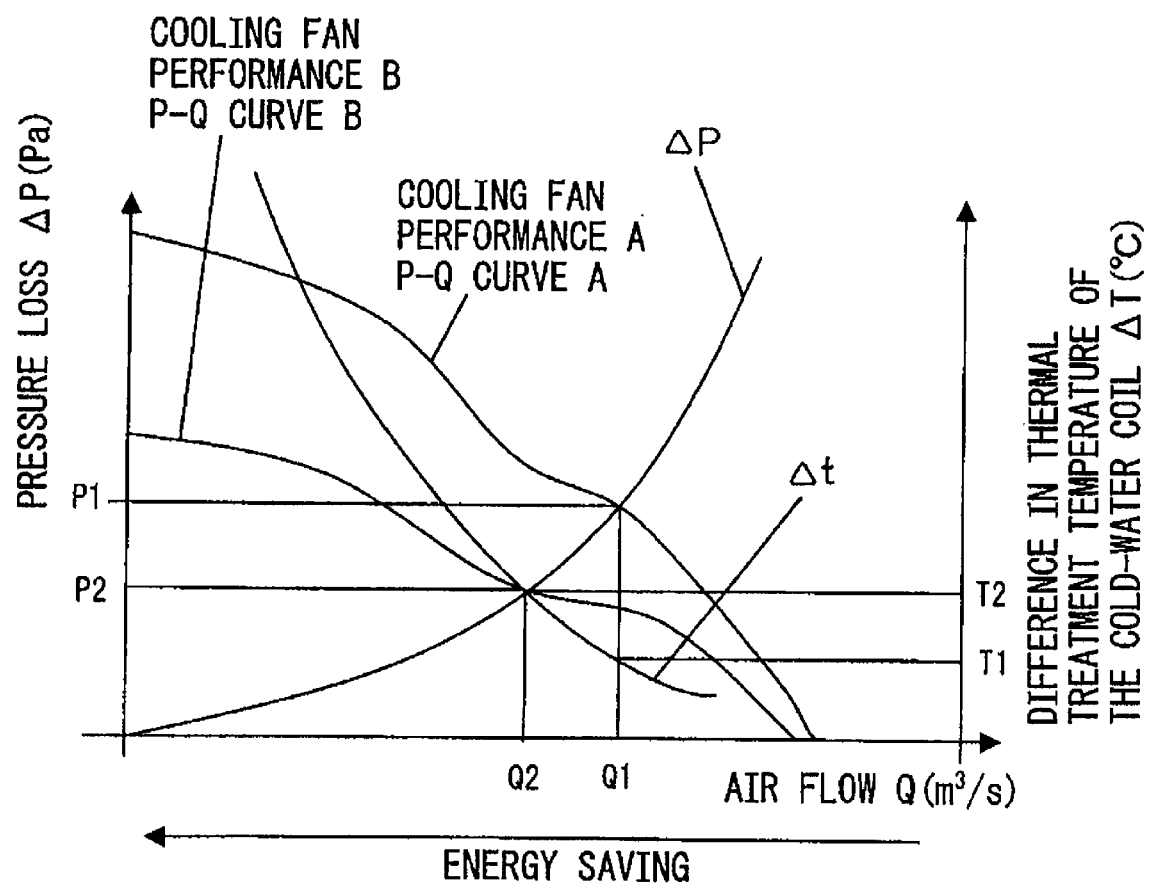

COOLING SYSTEM FOR INFORMATION DEVICE

CROSS-REFERENCE TO RELATED APPLICATION

This application claims priority from, and incorporates by reference the entire disclosure of Japanese Patent Application No. 2007-74810, filed on Mar. 22, 2007.

BACKGROUND OF THE INVENTION

1. Field of the Invention

The present invention relates to a cooling system for an information device, and more specifically a cooling system for preventing an information device used in a data center, a server room, etc., from thermally running out of control due to overheating.

2. Description of the Related Art

Conventionally, a number of servers as information devices are placed in e.g. a company's server room, a data center where an information device such as a computer is used to perform data calculation, data summarization, etc. In a room where a server is used, an air-conditioning device keeps the room temperature at a certain fixed value in order to prevent the server from thermally running out of control due to overheating. For a conventional server-cooling system using an air-conditioning device, a method of cooling an entire room thereby to cool a server placed in the room has been adopted.

On the other hand, in recent years, a space-saving compact server, which is termed a blade type server, is becoming more common. A blade type server consists of a set of about ten slim boards (blades) mounted in a box-type case and each board has a function comparable to that of a server for personal computers. The enclosures of such blade type servers are stacked in a rack having a height of about 2 meters. In a data center and the like, a number of such racks are arrayed in positions in an air-conditioned room.

A conventional method of cooling racks in an air-conditioned room is as follows: preparing a number of rows of racks each composed of racks arrayed in positions in a lateral direction; and blowing cooling air, which flows under the floor from an air conditioner positioned near a wall of the room, into cooling aisles formed between the rack rows, thereby to cool the rack rows, which is then warmed and returned to the air conditioner through warm air passages.

However, such blade type servers are large in processing power, and therefore consume a large amount of electric power and generate a large amount of heat. In cases where the amount of heat generated by servers is not so large, a conventional cooling system which cools a whole room can be used to lead cooling air to cooling aisles and cool each server. However, in cases where the density of heat generated by servers is larger, the temperature of the servers cannot be lowered only by cooling air, which is supplied from an air conditioner positioned near a wall of the room, from under the floor to cooling aisles, and hot spots occur at unexpected places. Hence, a conventional cooling system which cools a whole room has not been able to cool a device with a high heat generation density.

Therefore, another cooling system has been used, which includes: covering a whole rack with a housing; providing a blower fan and a cooling coil in the housing; and circulating cooling air in the housing thereby cooling a server case. The cooling system is advertised in a brochure by APC Japan Inc.

However, in the case where cooling air is circulated in a housing has been used, a duct area for circulating cooling air or the like is required for each rack, and a high-speed air flow needs to be used for cooling a heat source with a high heat generation density. The size of the duct areas is large, which poses a problem that the number of racks which can be placed in an air-conditioned room is reduced.

SUMMARY OF THE INVENTION

It is an object of the invention to provide a server-cooling system which can improve conventional cooling of a heat generating rack in an air-conditioned room, and cool many racks efficiently in a smaller space.

The server-cooling system of the invention which achieves the above-described object is a server-cooling system for cooling blade type servers each composed of a case with slim boards housed therein in an air-conditioned room. The server-cooling system includes: a rack having cases stacked in at least one row; a cooling coil having a coolant passage and a cooling fin, and cooling air; a fan unit having axial-flow fans placed therein and producing one-way air currents; and a shell having a ventilation passage, and accommodating racks, cooling coils, and at least one fan unit in the ventilation passage, the shell having the rack, cooling coil and fan unit housed therein. Further, an outercover (hereinafter referred to as a shell) is placed in the air-conditioned room, and the cooling coils and racks are disposed alternately along the flow of air in the ventilation passage, and the fan unit forces the cooling air to flow in the ventilation passage in one direction.

In this case, the fan unit can be placed for each rack in the ventilation passage, and by controlling the temperature of coolant supplied into the coolant passage, the cooling coil can be compared of a dry coil in which no condensation results on the coolant passage and fin.

Further, the following arrangement can be made, i.e., a gap portion in which none of the racks, cooling coil and fan unit are placed is provided in a middle of the shell, and doors are provided respectively in two wall faces of the shell opposed to each other with the gap portion interposed therebetween, for allowing a person crossing the shell. Still further, the following arrangement can be made, i.e., more than one shell is placed in the air-conditioned room, and the air outlet of one shell is connected to the air inlet portion of another shell through a connection passage sequentially. As a result, air discharged from one shell can be supplied to an air inlet portion of another shell without leakage.

According to the invention, the power supply to the fan can be reduced by arraying racks in a shell and flowing cooling air in a one-way direction in the shell. Further, in the case of a cooling rack per se, an auxiliary fan unit needs to be provided in combination with a primary fan unit for each rack in order to build a cooling structure of the fan units. However, according to the invention, the cooling structure of fan units can be built between racks by linking the racks to one another, which leads to reduction in auxiliary fan units. Consequently, the cooling structure can be built by a reduced number of fan units. Still further, as the racks are linked in the shell, and the cooling coil is placed on the air outlet side of each rack, it is also possible to exhaust the cooled air by the cooling coils. Moreover, a server-cooling system such that air expelled from the shell which does not affect the temperature of air in a room, can be built because the racks are linked in the shell, and the cooling coil is placed in an air-outlet portion, through which air is expelled from the shell.

BRIEF DESCRIPTION OF THE DRAWINGS

The present invention will be more clearly understood from the description as set forth below with reference to the accompanying drawings, wherein:

FIG. 8A is a block diagram showing another example of the structure of the device for adjusting the temperature of cooling water flowing through the cooling coil;

FIG. 8B is a block diagram showing another example of the structure of the device for adjusting the temperature of cooling water flowing through the cooling coil;

FIG. 12 is a plane view showing a modification of the server-cooling system according to the invention, in which a pass room is provided in the middle of the server-cooling system;

FIG. 13 is a perspective view showing an example of a server-cooling system according to the invention having three server-cooling systems identical to the server-cooling system shown in FIG. 12 placed in parallel and connected by ducts with one another;

FIG. 14 is a perspective view showing an example of a server-cooling system according to the invention having two server-cooling systems identical to the server-cooling system shown in FIG. 12 placed in parallel and connected by ducts with each other to form a closed flow path;

FIG. 15 is a perspective view showing another example of the server-cooling system shown in FIG. 14, in which pathways having a structure like camera's bellows are provided to a closed flow path instead of the ducts;

FIG. 16A is a block diagram showing the structure of a minimum unit of the server-cooling system according to the invention, in which axial-flow fans are provided in tandem;

FIG. 16B is an illustration explaining the arrangement where four minimum units identical to the minimum unit shown in FIG. 16A are placed in parallel in a data room and cooling air flow Q are supplied to the respective minimum units;

FIG. 16C is an illustration explaining the arrangement where four minimum units identical to the minimum unit shown in FIG. 16A are placed in series in a data room and a cooling air flow Q is supplied to one end thereof;

FIG. 16D is a table of comparisons between the arrangements of the minimum units shown in FIGS. 16B and 16C in noise, amount of discharge, footprint, and load of an air conditioner;

FIG. 17A is an illustration showing a server-cooling system according to the invention having four minimum units identical to the minimum unit shown in FIG. 16A connected in series, provided that one of the fan units in the final stage is faulty;

FIG. 17B is an illustration showing a server-cooling system according to the invention having a structure the same as that shown in FIG. 17A, but reduced by one in the number of axial-flow fans in each minimum unit;

FIG. 17D is a table for making comparisons among the arrangements of the server-cooling systems shown in FIGS. 17A-17C in the number of the incorporated fans, the probability of the fans breaking down, the amount of discharge, electric power of the fans, and the difference in thermal treatment temperature of cold-water coils;

FIG. 18A is a temperature distribution chart showing temperatures in the constituents of the cooling systems shown in FIGS. 17A-17C;

FIG. 18C is characteristics chart showing the relation among performance of the cooling fans, the pressure loss and the air low;

DESCRIPTION OF THE PREFERRED EMBODIMENTS

Before describing the preferred embodiments, an explanation will be given of a conventional cooling system for information devices shown in FIGS. 1A to 2B.

Figure 1A:
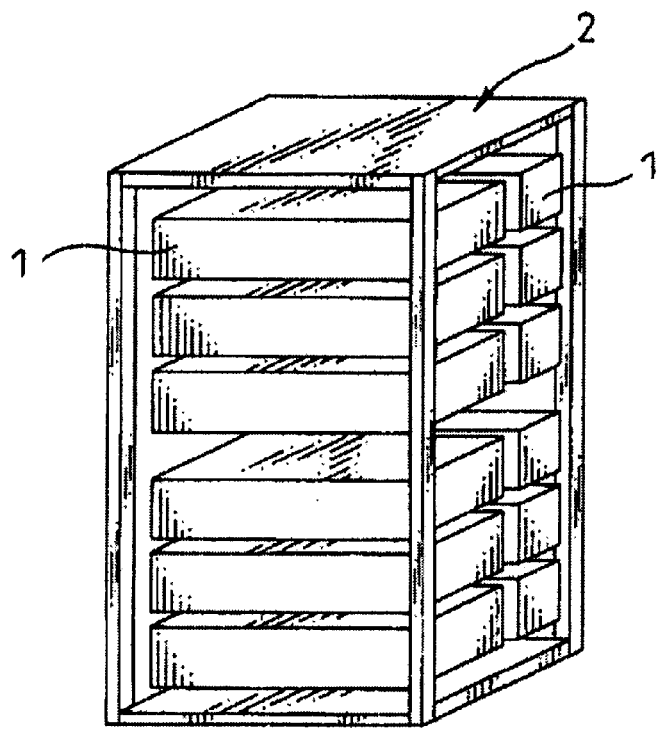
FIG. 1A is a perspective view showing an appearance of a rack with cases stacked in two rows, provided that blade type servers are housed in each case.
Figure 1B:
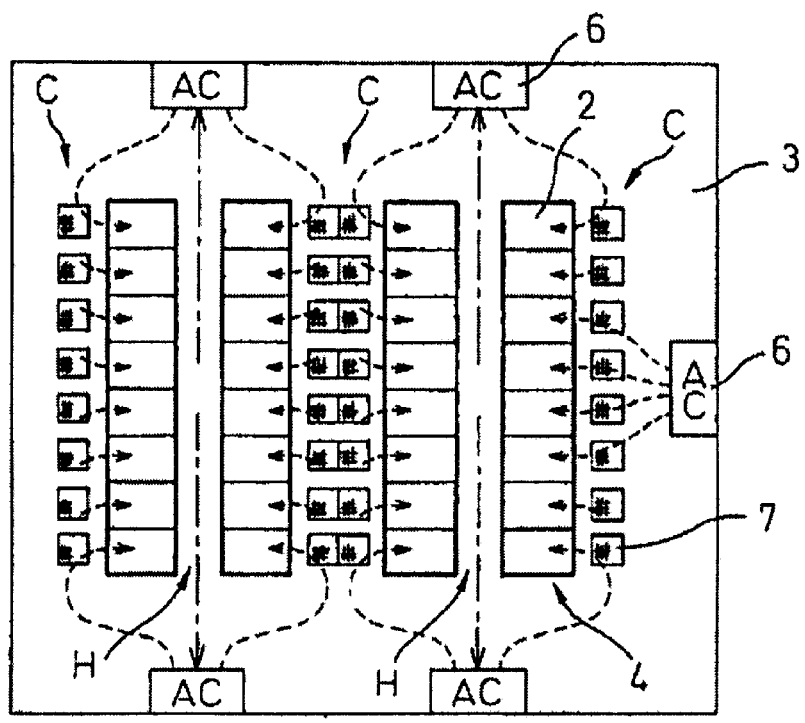
FIG. 1B is a plane view showing the structure of a conventional room-cooling system which uses an air conditioner to cool racks disposed in a data center.

FIG. 1A shows a rack with cases stacked in two rows, in which blade type servers are housed in each case. The blade type server rack has a height of about 2 meters. In a data center or the like, a number of such racks are arrayed in positions in an air-conditioned room 3 dedicated to blade type servers, as shown in FIG. 1B. The air-conditioned room 3 needs to be cooled to prevent the temperature from rising because almost all of electric power supplied to the racks generates heat.

In the air-conditioned room 3, rack rows 4 each composed of racks 2 arrayed in a lateral direction are prepared. Further, the rack rows 4 are arrayed in rows in parallel, and warm air passages H and cooling aisles C are formed alternately between the rack rows 4. Conventional cooling of racks 2 in such air-conditioned room 3 is as follows: cooling air flows under the floor from an air conditioner 6 positioned near a wall of the room; blowing the cooling air through holed tiles 7 which has a mesh of holes formed therein and which are placed in the cooling aisles C; and flowing cooling air from the cooling aisles C to the warm air passages H thereby to cool the rack rows 4. The cooling air after having cooled the rack rows is turned into warm air, and returned to the air conditioner 6 through warm air passages H.

However, such blade type servers are large in processing power, and therefore consume a large amount of electric power and generate a large amount of heat. In cases where the amount of heat generated by servers is not so large, a conventional cooling system which cools a whole room can be used to flow a cooling air to cooling aisles and cool each server. In contrast, in cases where the density of heat generated by servers is larger, the temperature of the servers cannot be lowered only by leading a cooling air, which is supplied from an air conditioner 6 positioned near a wall of the room, from under the floor to cooling aisles C, and there has been a risk that a hot spot occurs at an unexpected place. Hence, the conventional cooling system which cools a whole room has not been able to cool a device with a high heat generation density.

Figure 2A:
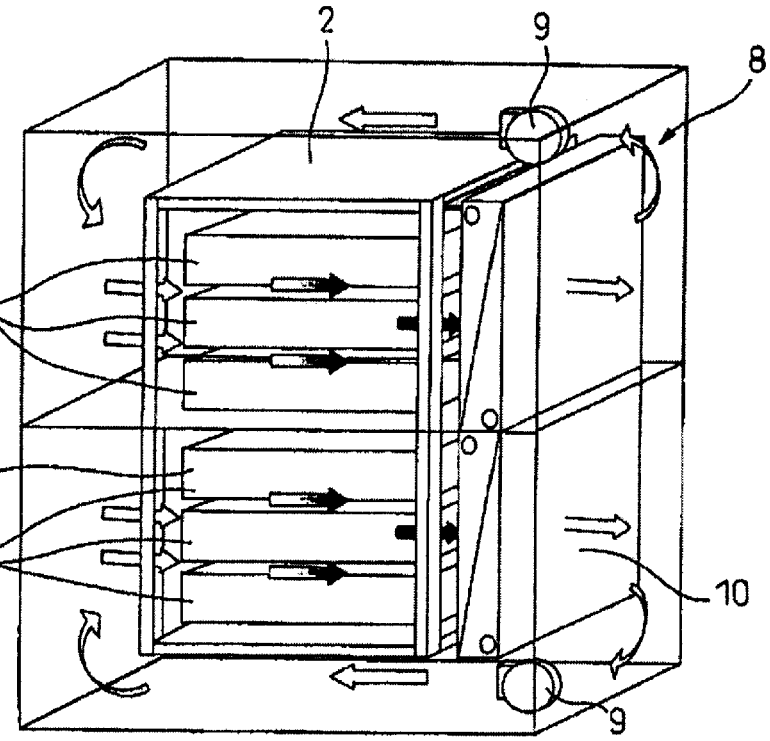
FIG. 2A is a perspective view showing an example of a conventional rack-cooling system which cools racks individually.
Figure 2B:
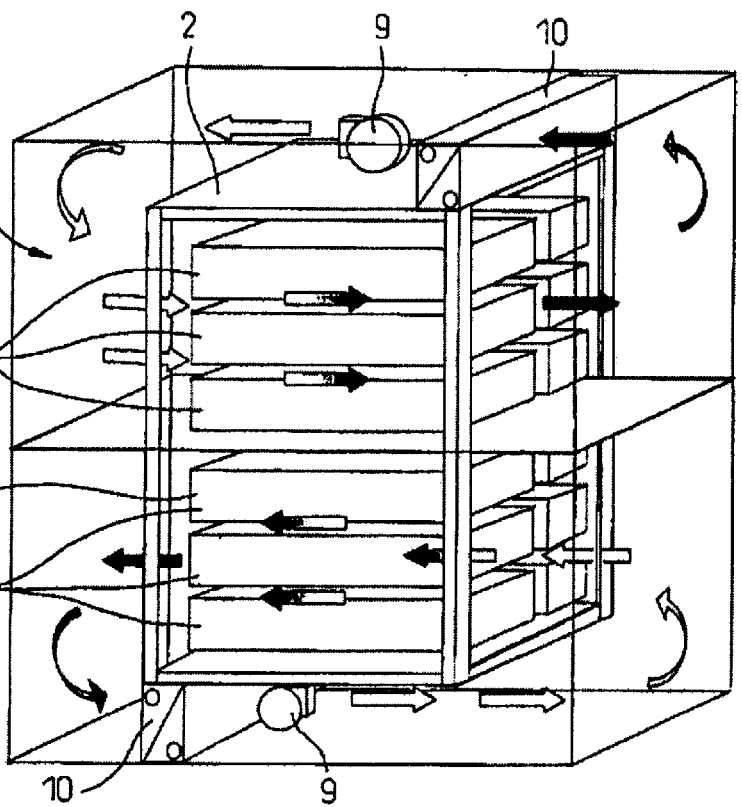
FIG. 2B is a perspective view showing another example of the conventional rack-cooling system.

Therefore, another cooling system as shown in FIGS. 2A and 2B has been used, which includes: covering a whole rack 2 with a housing 8; providing a blower fan 9 and a cooling coil 10 in the housing 8; and circulating a cooling air in the housing 8 thereby to cool a case 1 as a portion to be cooled put in the rack 2.

However, in the case in which cooling air is circulated in a housing 8 has been adopted, a duct area for circulating the cooling air or the like is required for each rack, and a high-speed air flow needs to be used for cooling a heat source with a high heat generation density. The size of the duct areas is large, which poses a problem that the number of racks which can be placed in an air-conditioned room is reduced.

This invention attempts to solve the above problems. The present invention will be described below in detail based on the specific embodiments thereof. In descriptions of embodiments of the present invention, for a better understanding, the same reference numerals will be assigned to components identical to those of the conventional cooling system described in conjunction with FIGS. 1A-2B.

Figure 3A:
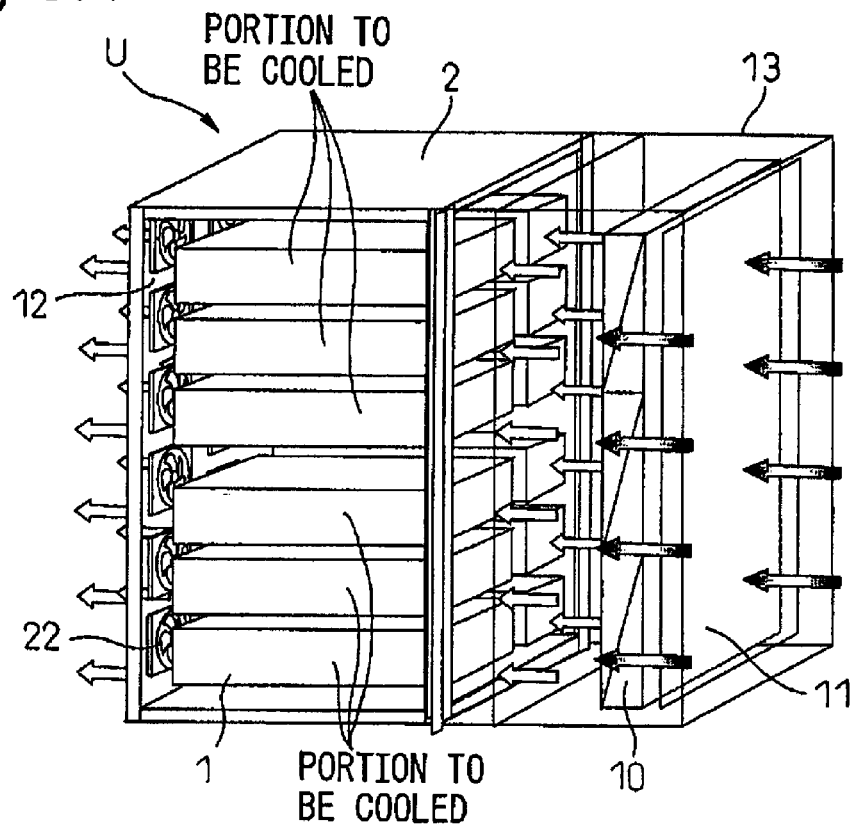
FIG. 3A is a perspective view showing an example of the structure of a minimum unit of a server-cooling system according to the invention.
Figure 3B:
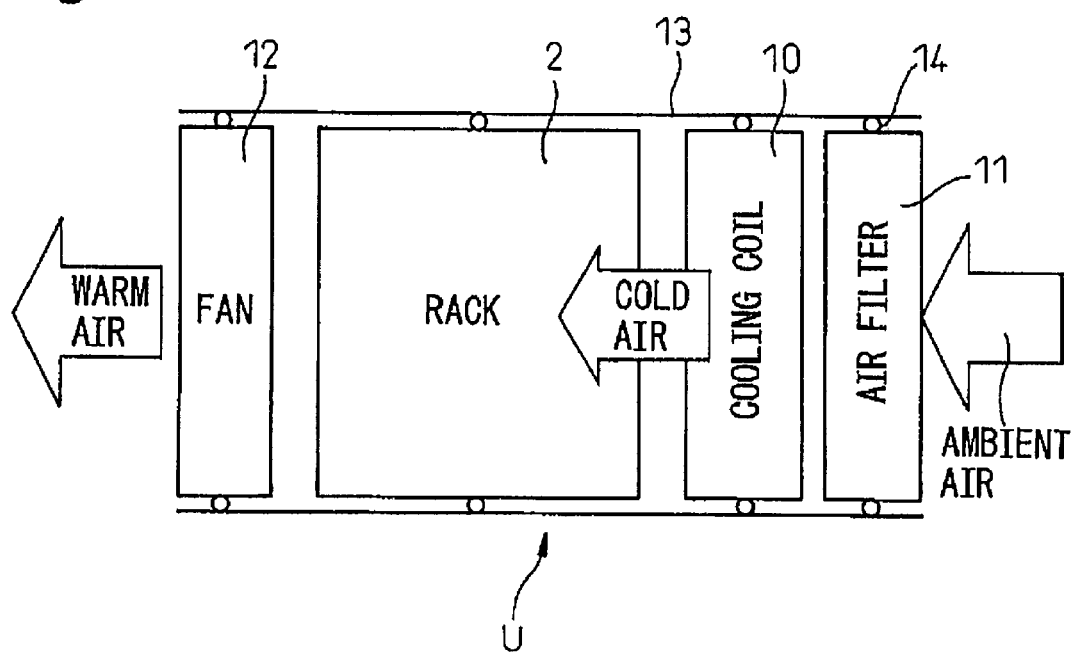
FIG. 3B is a block diagram showing the structure shown in FIG. 3A with blocks in plane view.

FIG. 3A shows the structure of a minimum unit U of the server-cooling system according to an embodiment of the invention. FIG. 3B shows the minimum unit U shown in FIG. 3A in a plane view. The minimum unit U of this embodiment has a shell 13 having a ventilation passage of cooling air. The minimum unit U includes, in the shell 13, an air filter 11, a cooling coil 10, a rack 2, and a fan unit, which is denoted by "fan" in the drawing, which are disposed along the flow of the air in this order. In this embodiment, a seal member 14 is provided between the shell 13, and each of the air filter 11, cooling coil 10, rack 2 and fan unit 12. It should be noted that the air filter 11 is not necessarily provided for all the minimum units U, but may be attached only to an intake of ambient air.

The fan unit 12 is composed of a plurality of compact axial-flow fans 22 arrayed in a vertical direction. In this embodiment, two axial-flow fan rows each composed of six axial-flow fans 22 arrayed in the vertical direction are provided in parallel in a lateral direction. Further, in this embodiment, the shell 13 is arranged so that all of the air filter 11, cooling coil 10, rack 2 and fan unit 12 are housed therein. However, in the case where the rack 2 has an exterior wall face which defines a ventilation passage, the exterior wall face may be used as a shell. In this case, the shell 13 housing the air filter 11 and cooling coil 10 may be connected with the exterior wall face of the rack 2 so as not to allow leakage of the cooling air, and the fan unit 12 can be attached to a frame of the rack 2.

Figure 4A:
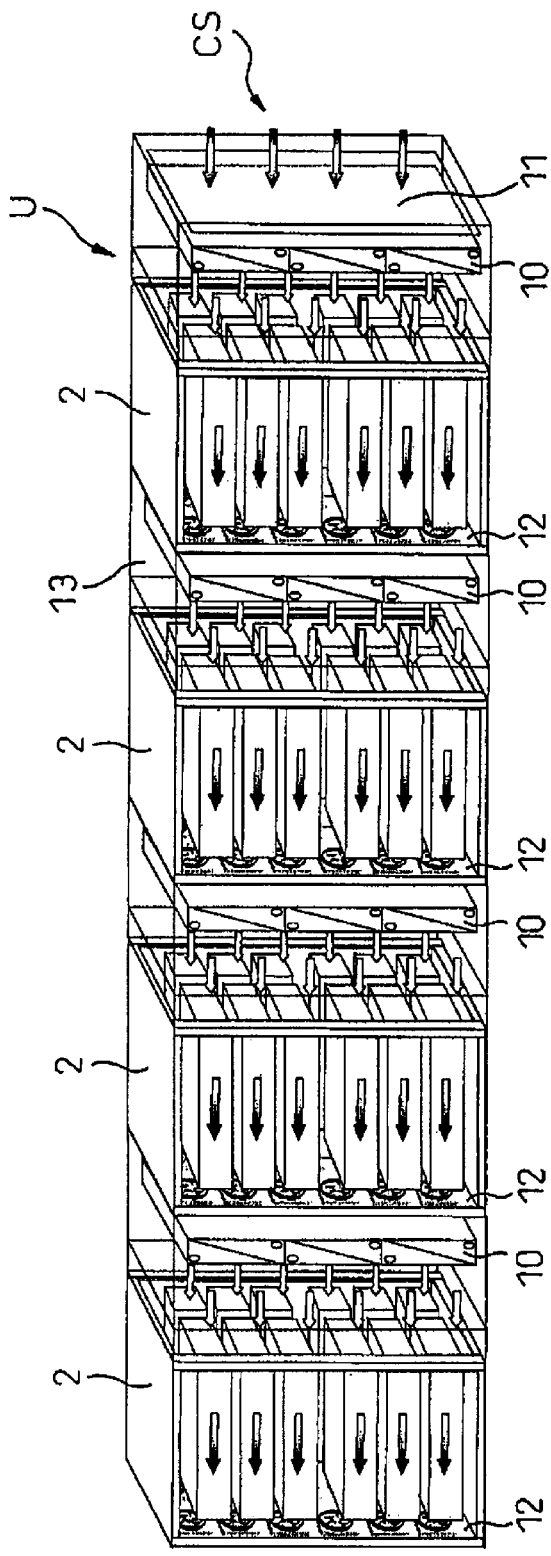
FIG. 4A is a perspective view showing a basic structure of a server-cooling system according to the invention, which is composed of a combination of mutually linked server-cooling systems identical to the server-cooling system shown in FIG. 3A.
Figure 4B:
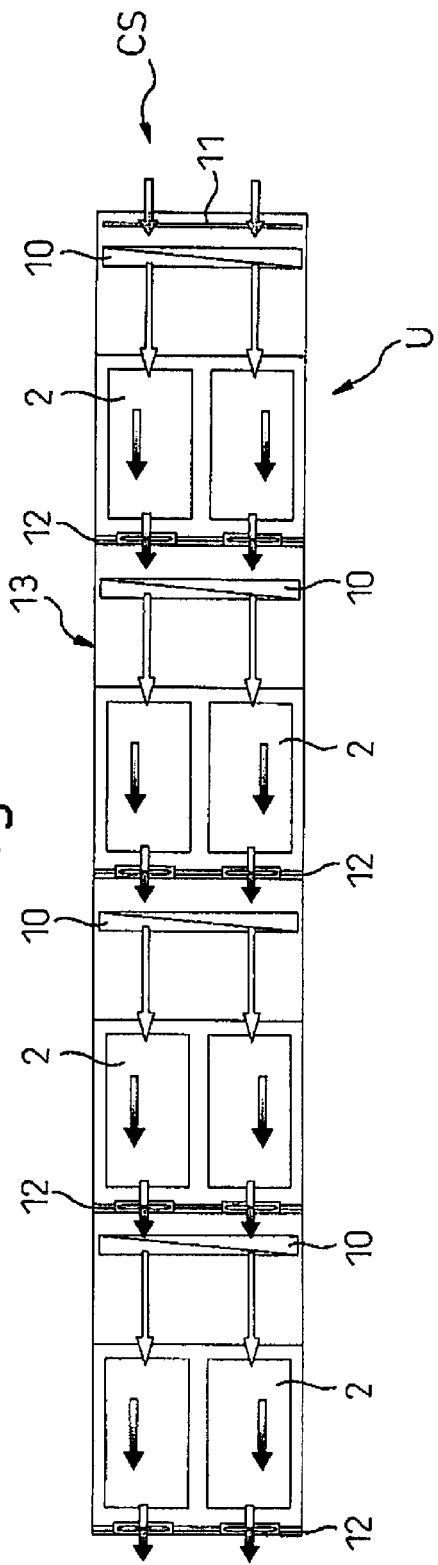
FIG. 4B is a plane view of the server-cooling system shown in FIG. 4A.

In the cooling system according to the invention, minimum units identical to the minimum unit U arranged shown in FIGS. 3A and 3B are linked as shown in FIGS. 4A and 4B. In this embodiment, four minimum units U are linked to one another. Further, the shell 13 is a linkable-type shell in this embodiment; however the shell may be an integration-type shell in which all of the four minimum units U can be housed. In this embodiment, the air filter 11 is provided only on the minimum unit U placed next to the intake of ambient air. Such cooling system CS having four minimum units linked in this way in this embodiment is placed in an air-conditioned room of a data center or the like. The structure like this allows racks to be thermally processed with a minimum amount of air blowing required for one minimum unit U.

Therefore, the ambient air entering the air filter 11 of the minimum unit U which is placed in the first stage of the cooling system CS is a cooling air which has been cooled by an air conditioner positioned in the air-conditioned room. The cooling air having flowed into the cooling system CS undergoes cooling by the cooling coil 10, cools the rack 2, increases in temperature, and is sent to the cooling coil 10 of the subsequent stage by the fan unit 12. Then, the cooling air is cooled by the cooling coil 10, cools the rack 2, increases in temperature, and is sent to the cooling coil 10 of the subsequent stage by the fan unit 12, again. After that, the actions are repeated, the air is discharged through the fan unit 12 of the minimum unit U of the final stage into the air-conditioned room. As described above, in the cooling system CS according to the invention, the cooling air cools the racks 2 while passing through the inside of the shells 13 along one direction. It should be noted that the cooling air (air current) flowing through the inside of the ventilation passage fluctuates in temperature because it is cooled by the cooling coils 10, and increased in temperature as a result of cooling the racks 2; however all of the air passing through the ventilation passage is hereinafter referred to as "cooling air".

Figure 5A:
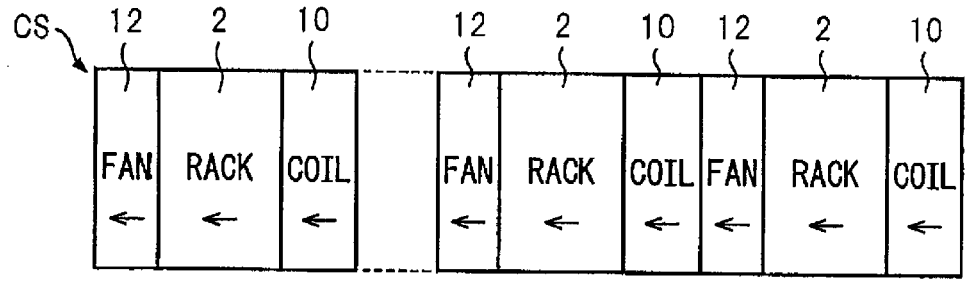
FIG. 5A is a block diagram showing, in blocks, a structure formed by repeating a combination of a cooling coil, racks and a fan unit as shown in FIGS. 4A and 4B in blocks.
Figure 5B:
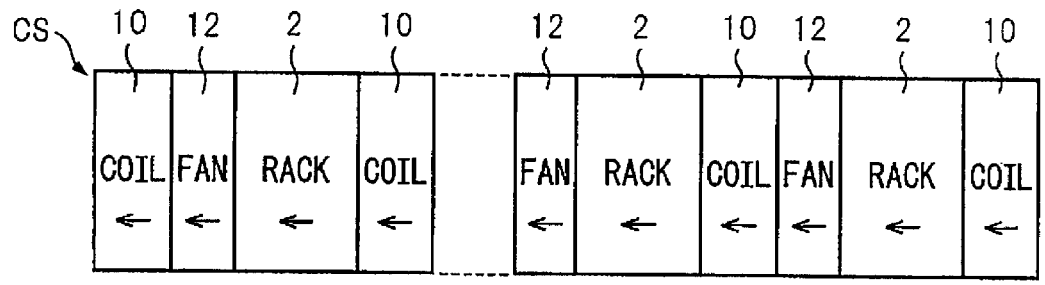
FIG. 5B is a block diagram showing a structure formed by further adding a cooling coil to the final stage of the structure shown in FIG. 5A.
Figure 5C:
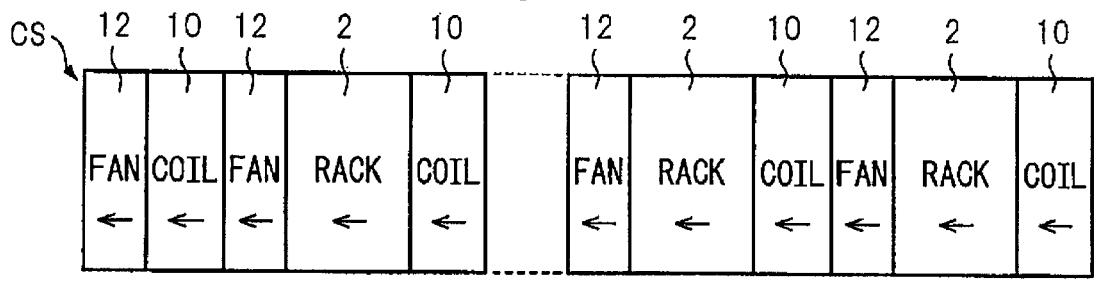
FIG. 5C is a block diagram showing a structure formed by further adding a fan unit to the final stage of the structure shown in FIG. 5B.
Figure 5D:
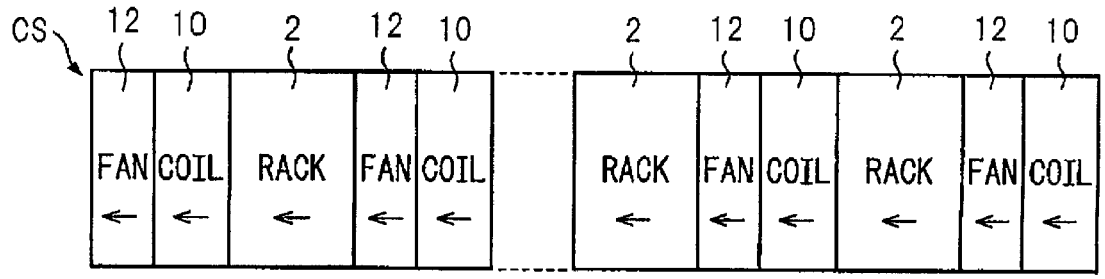
FIG. 5D is a block diagram showing another structure different from the structure shown in FIGS. 4A and 4B in the order that the combination of the cooling coil, rack and fan unit follows when being arrayed in therein.

FIG. 5A shows a structure of the cooling system CS including a combination of the cooling coils 10, racks 2 and fan units 12 shown in FIGS. 4A and 4B in blocks. With this structure, the cooling air discharged from the fan unit 12 of the final stage has been warmed by the rack 2. Hence, a cooling coil 10 may be added to the fan unit 12 of the final stage as shown in FIG. 5B. In addition, as shown in FIG. 5C, a fan unit 12 may be further added to the additional cooling coil 10 shown in FIG. 5B, thereby to allow the cooling air to be discharged into the air-conditioned room smoothly. Further, the order which the combination of the cooling coil 10, rack 2 and fun unit 12 as shown in FIG. 5B follows may be changed to the order of the cooling coil 10, fan unit 12 and rack 2 as shown in FIG. 5D, and a combination of a cooling coil 10 and fan unit 12 may be added to the final stage.

Figure 6A:
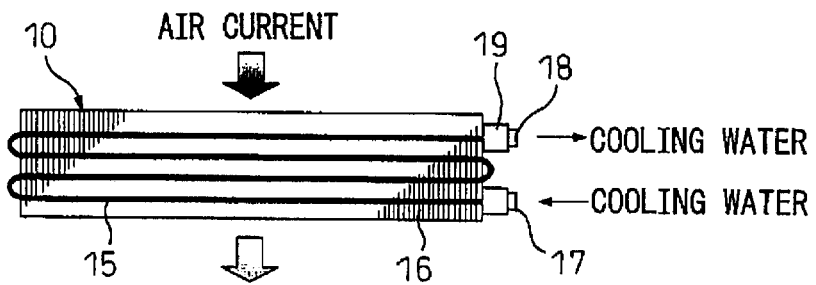
FIG. 6A is a plane view of the cooling coil used in the server-cooling system according to the invention.
Figure 6B:
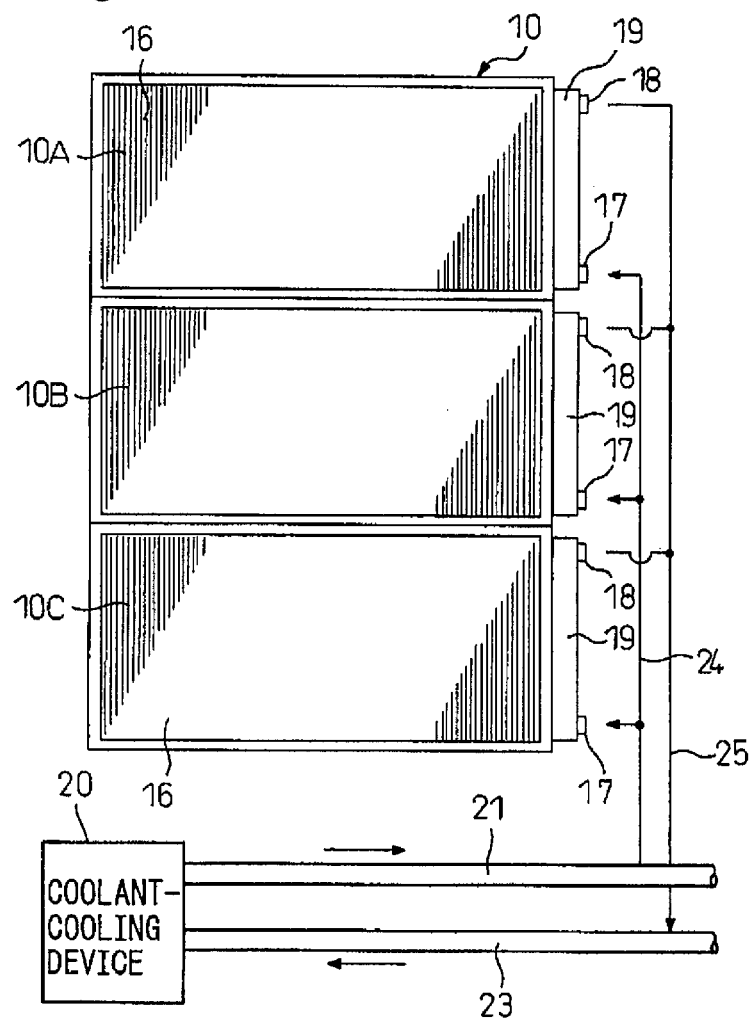
FIG. 6B is a front view of the cooling coil shown in FIG. 6A.
Figure 6C:
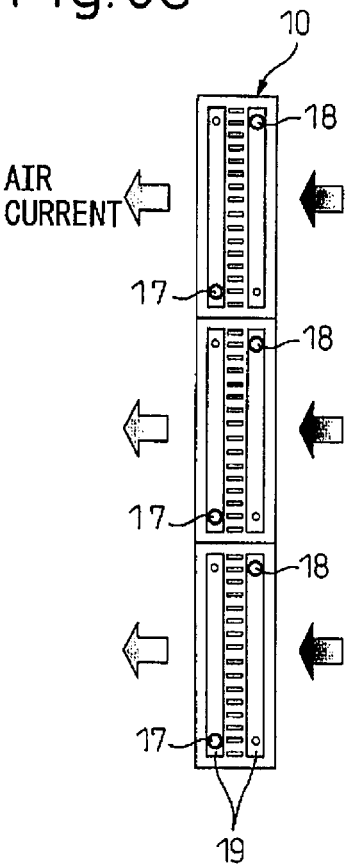
FIG. 6C is a side view of the cooling coil shown in FIG. 6A.

A set of FIGS. 6A to 6C shows the structure of the cooling coil 10 used in the server-cooling system CS according to the invention. Of the drawings, FIG. 6A is a plane view, FIG. 6C is a front view, and FIG. 6C is a side view. The cooling coil 10 has: a coolant passage 15 through which a coolant is flowed; and a cooling fin 16 connected with the coolant passage 15 for exchanging heat with the cooling air. In this embodiment, the cooling coil 10 is composed of three cooling coils 10A, 10B and 10C, and cooling water is used as the coolant. The coolant passage 15 is composed of a length of copper tube. The three cooling coils 10A, 10B and 10C each have a header 19 provided with a cooling-water inlet 17 and a cooling water outlet 18. While the cooling coil 10 is divided into three in this embodiment, the number of pieces that the cooling coil 10 is divided into is not particularly limited.

The cooling system CS according to the invention has a coolant-supply duct 21 and a coolant-recovery duct 23. The coolant-supply duct 21 is connected to the cooling-water inlet 17 through a branch duct 24. The coolant-recovery duct 23 is connected to the cooling water outlet 18 through a branch duct 25. The warmed cooling water recovered through the coolant-recovery duct 23 is returned back to a coolant-cooling device 20, cooled there and made to flow into the coolant-supply duct 21 again.

Figure 7A:
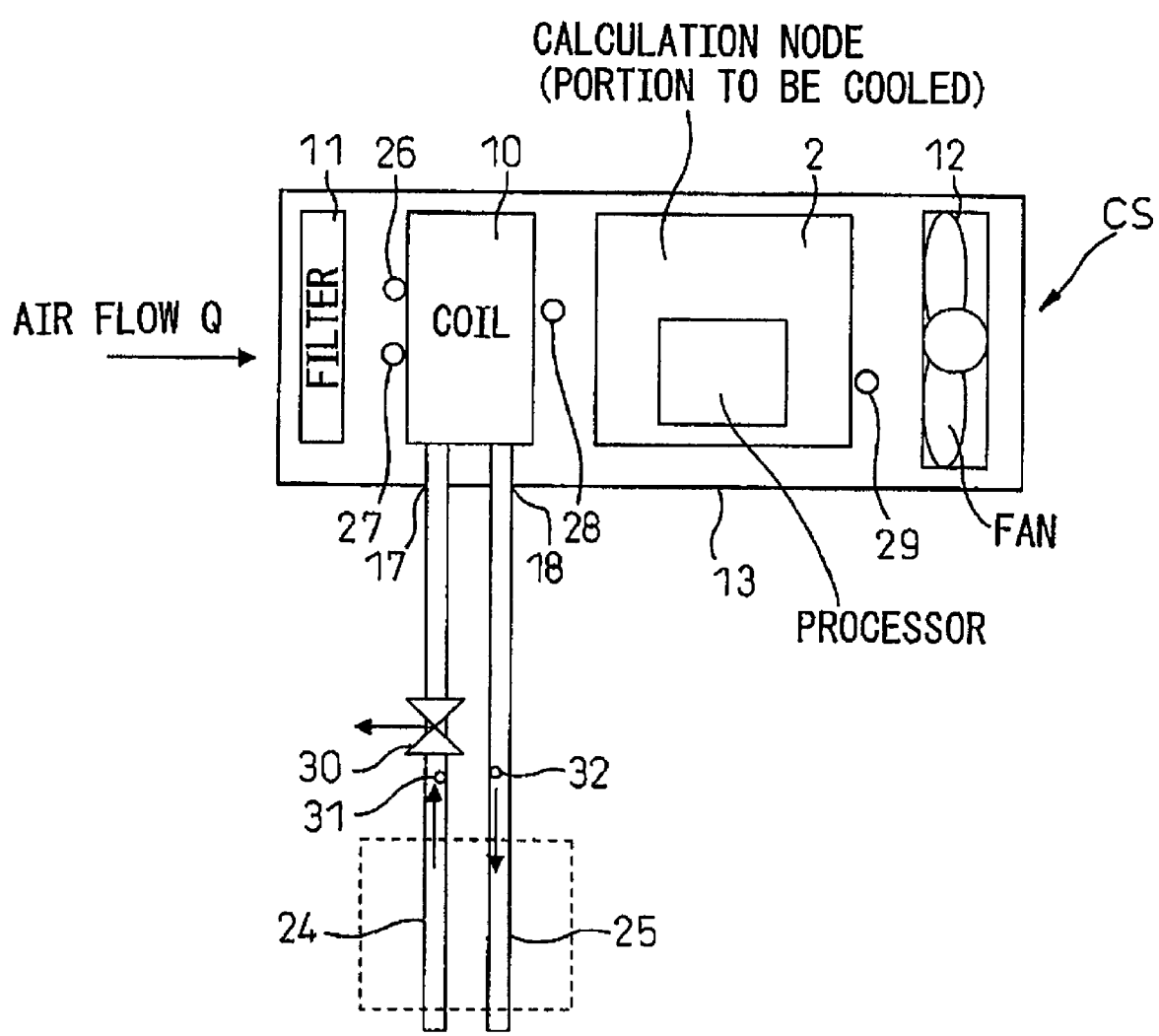
FIG. 7A is a block diagram showing an example of the structure of a device for adjusting the temperature of cooling water flowing through the cooling coil according to the invention.

FIG. 7A shows the structure of a device for adjusting the temperature of the cooling water made to flow through the cooling coil 10 according to an embodiment of the invention. In the cooling system CS according to the invention, the cooling coil 10 placed in a stage in front of each rack 2 in the shell 13 is a dry coil. The dry coil makes the temperature of cooling water to be supplied a temperature above a condensation point temperature under the air condition in the air-conditioned room, thereby to prevent a thermal-processing air from being cooled and dehumidified and keep a relative humidity in the rack 2 within a fixed range, and therefore prevent flying of condensed moisture and buildup of electrical charge.

On this account, as shown in FIG. 7A, the temperature and humidity of the cooling air in the rack 2 are measured by a coil-inlet air temperature sensor 26, a coil-inlet air humidity sensor 27, a coil-outlet air temperature sensor 28, and a discharged-air temperature sensor 29; the temperature of the coolant flowing into the cooling coil 10 is detected by a coil-inlet water temperature sensor 31 and a coil-outlet water temperature sensor 32. The temperatures detected by the sensors are monitored, whereby the amount of the cooling water supplied to the cooling-water inlet 17 of the cooling coil 10 is controlled by an electromagnetic valve 30 provided in the branch duct 24 before the temperatures reach the condensation point temperature at which condensation is caused on the cooling coil 10. Thus, the control is performed so that the sufficient difference between the condensation point temperature and current temperature of the cooling water is maintained reliably.

Figure 7B:
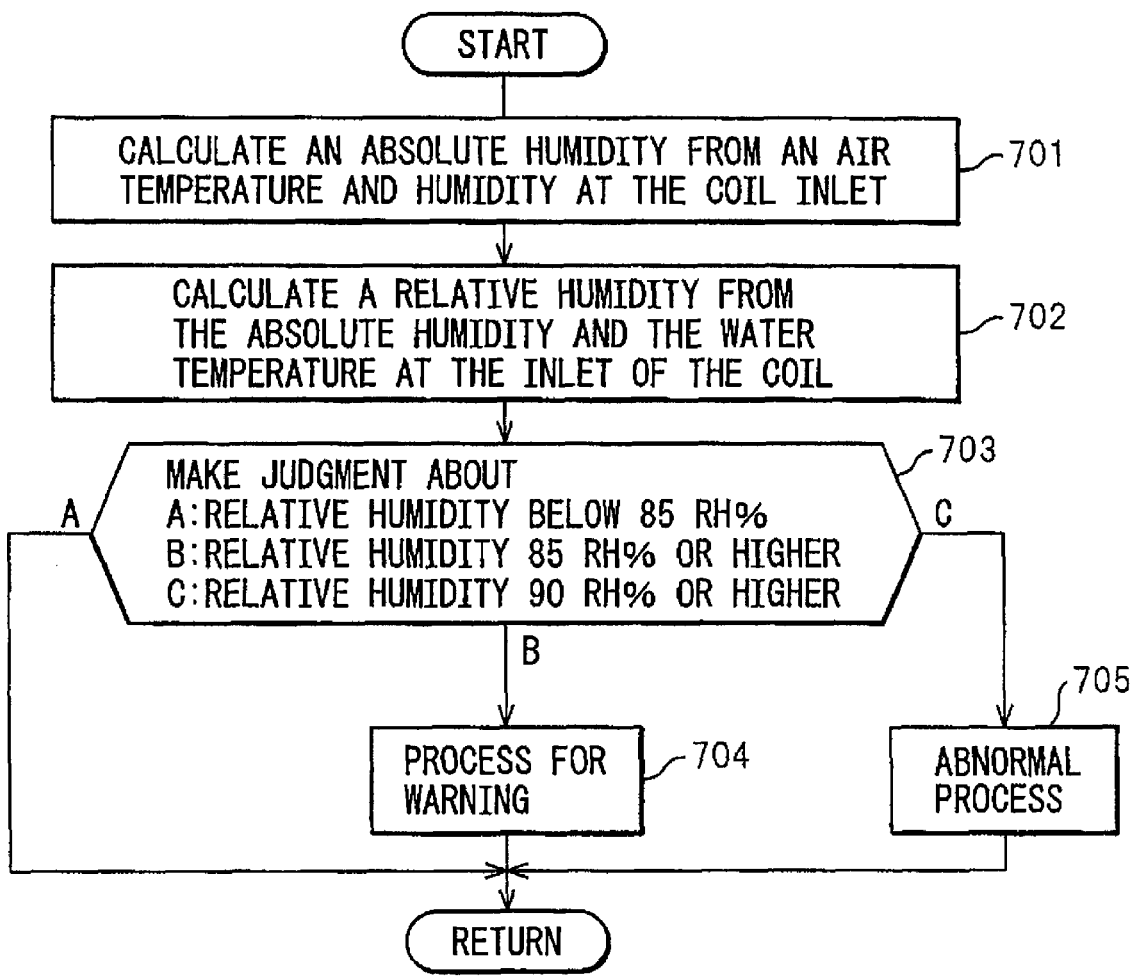
FIG. 7B is a flow chart showing an example of a series of operations of the device shown in FIG. 7A.

FIG. 7B is a flow chart showing an example of a series of operations of the device shown in FIG. 7A. The process by the series of operations is carried out at intervals of a predetermined length of time. At Step 701, an absolute humidity is calculated from the temperature and humidity of air at the inlet of the coil. Subsequently, at Step 702, a relative humidity is calculated from the absolute humidity and the water temperature at the inlet of the coil. Then, at Step 703, judgments about the following items A, B and C are made.

A: the relative humidity is below 85 RH %.
B: the relative humidity is not less than 85 RH %.
C: the relative humidity is not less than 90 RH %.

In the case where it has been judged that the item A applies to the result of the calculation, the routine is terminated immediately. When it has been judged that the item B applies to the result of the calculation, the operation by the device proceeds to Step 704, where a process for warning is performed, and then the routine is terminated. When it has been judged that the item C applies to the result of the calculation, the operation by the device proceeds to Step 705, where an abnormal process is executed, and then the routine is terminated.

As the process for warning, it is sufficient to just provide a notification of warning about a high humidity, for example. As for the abnormal process, the following are possible, for example: to perform the activity of providing a notification of the abnormality of high humidity and concurrently closing the electromagnetic valve 30; and to perform the activity of providing a notification of the abnormality of high humidity and concurrently closing the electromagnetic valve 30, and further execute the activity of stopping the system of a calculation node (blade type server) in the rack or cutting off the power supply to the system.

FIG. 8A shows the structure of a device for adjusting the temperature of the cooling water flowing through the cooling coil 10 according to another embodiment, and the device is provided in the portion surrounded by a broken line shown in FIG. 7A. In this embodiment, a heat exchanger 35 thermally insulated from the ambient air is provided upstream of the coil-inlet water temperature sensor 31 of the branch duct 24, and an exchanger-inlet water temperature sensor 33 is provided upstream of the heat exchanger 35. In addition, two three-way valves 36 and 37 are provided at two locations in a portion of the branch duct 25 which is located in parallel with the heat exchanger 35. The warmed cooling water flowing through the branch duct 25 can be made to pass through the heat exchanger 35 by switching the three-way valves 36 and 37.

According to this structure, the temperature and humidity of the cooling air in each rack 2, and the temperature of the cooling water flowing into the cooling coil 10 disposed in the preceding stage of each rack 2 are monitored, and the warmed cooling water from the cooling water outlet of the cooling coil 10 is made to flow into the heat exchanger 35 by switching the three-way valves 36 and 37 before the temperatures reach the condensation point temperature at which condensation is caused on the cooling coil 10. As a result, the temperature of the cooling water flowing inside the branch duct 24 can be raised through the heat exchanger 35, and the control is performed so that the sufficient difference between the condensation point temperature and current temperature of the cooling water can be maintained reliably.

FIG. 8B shows the structure of a device for adjusting the temperature of the cooling water flowing through the cooling coil 10 according to another embodiment. In this embodiment, a heater 38 is provided upstream of the coil-inlet water temperature sensor 31 of the branch duct 24, and a heater-inlet water temperature sensor 34 is provided upstream of the heater 38. In addition, a portion surrounding the heater 38 is made an area thermally insulated from the ambient air.

According to this structure, the temperature and humidity of the cooling air in each rack 2, and the temperature of the cooling water flowing into the cooling coil 10 disposed in the preceding stage of each rack 2 are monitored, and the control is performed so that the cooling water to be supplied to the cooling-water inlet of the cooling coil 10 is heated by the heater 38, and the sufficient difference between the condensation point temperature and current coolant temperature is maintained reliably before the temperatures reach the condensation point temperature at which condensation is caused on the cooling coil 10.

In the case where the temperature of the cooling water flowing through the cooling coil 10 has been raised as described above, the temperature of air can be lowered to make an adjustment by reducing an air flow which is made to pass through the cooling coil 10, which is a dry coil, and increasing the amount of water-flow in the cooling coil 10. In this case, the air speed of the cooling air traveling inside the cooling coil 10 is lowered and the contact time of the cooling air with the cooling coil 10 becomes longer, therefore, the temperature of the cooling air becomes lower, since the temperature of the cooling water is still lower than the cooling air.

Figure 9A:
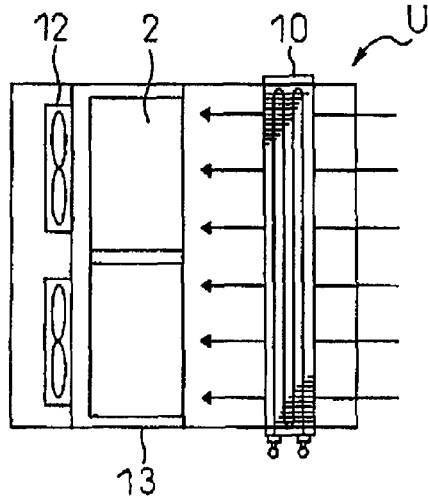
FIG. 9A is a plane view relating to the structure of the minimum unit of the server-cooling system shown in FIGS. 3A and 3B, in which the flow of cooling air when the breadth of the cooling coil is roughly as large as that of the case is shown.
Figure 9B:
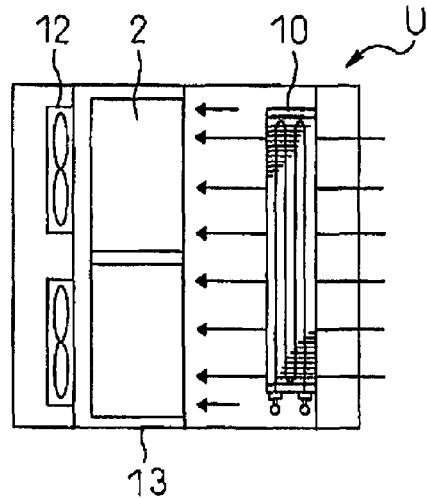
FIG. 9B is a plane view relating to the structure of the minimum unit of the server-cooling system shown in FIGS. 3A and 3B, in which the flow of cooling air when the breadth of the cooling coil is smaller than that of the case is shown.
Figure 9C:
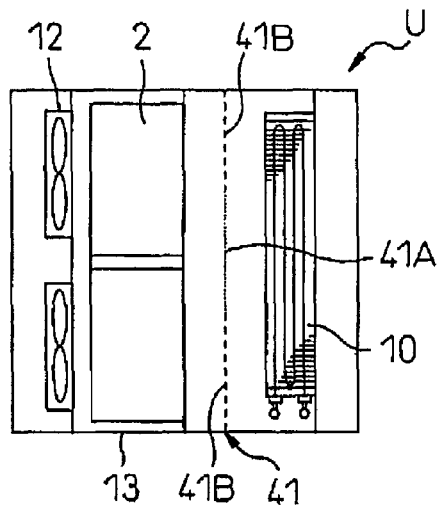
FIG. 9C is a plane view showing a structure of the minimum unit shown in FIG. 9B, in which a punching metal for applying the cooling air to the case evenly is provided between the cooling coil and case.
Figure 9D:
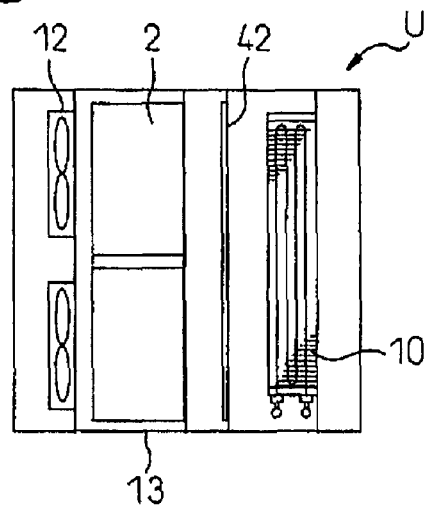
FIG. 9D is a plane view showing a structure of the minimum unit shown in FIG. 9B, in which an air filter for applying the cooling air to the case evenly is provided between the cooling coil and case.
Figure 9E:
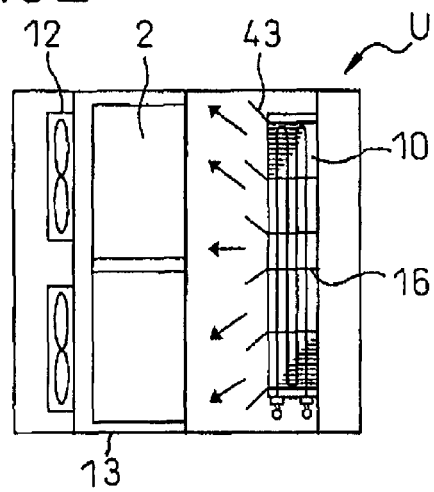
FIG. 9E is a plane view showing a structure of the minimum unit shown in FIG. 9B, in which an incline for applying the cooling air to the case evenly is provided on a fin of the cooling coil.
Figure 9F:
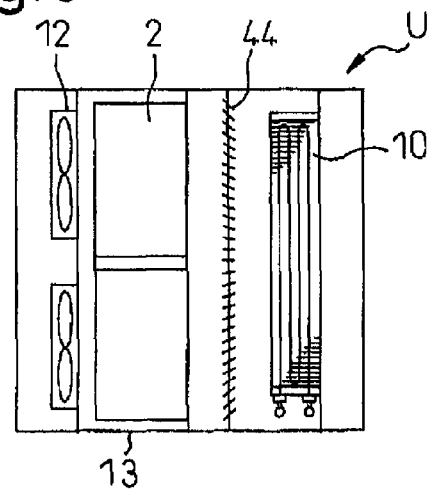
FIG. 9F is a plane view showing a structure of the minimum unit shown in FIG. 9B, in which a louver for applying the cooling air to the case evenly is provided between the cooling coil and case.

FIG. 9A shows an example of the structure of the minimum unit U of the server-cooling system CS shown in FIGS. 3A and 3B. In the case where the breadth of the cooling coil 10 is roughly as wide as that of the shell 13 with the rack 2 housed therein, the cooling air impinges on the rack 2 evenly. However, in the case where the breadth of the cooling coil 10 is smaller than that of the shell 13 with the rack 2 housed therein as shown in FIG. 9B, the cooling air does not impinge on the rack 2 evenly. In such case, any one of the following means may be adopted. The first is to provide a punching metal 41 having a fine-mesh portion 41A and coarse-mesh portion 41B for applying the cooling air to the rack 2 evenly between the cooling coil 10 and shell 13 as shown in FIG. 9C. The second is to provide an air filter 42 for applying the cooling air to the rack 2 evenly as shown in FIG. 9D. The third is to provide, on the fin 16 of the cooling coil 10, a protruding portion 43 with an incline for applying the cooling air to the rack 2 evenly as shown in FIG. 9E. The fourth is to a louver 44 for applying the cooling air to the rack 2 evenly as shown in FIG. 9F.

Figure 10A:
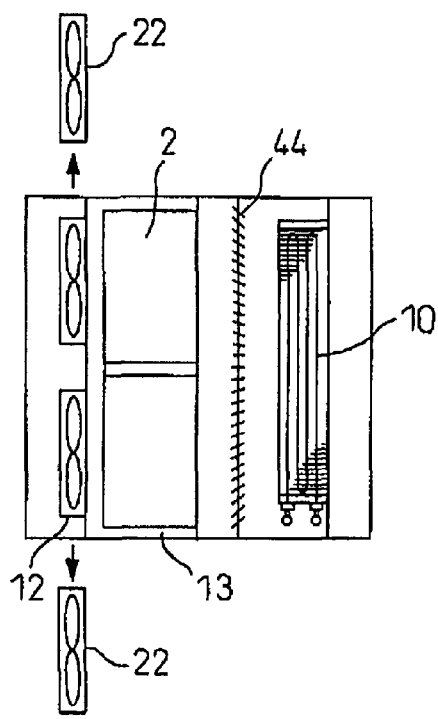
FIG. 10A is an illustration of assistance in explaining how the axial-flow fans used in the server-cooling system according to the invention can be withdrawn laterally for maintenance and exchange.
Figure 10C:
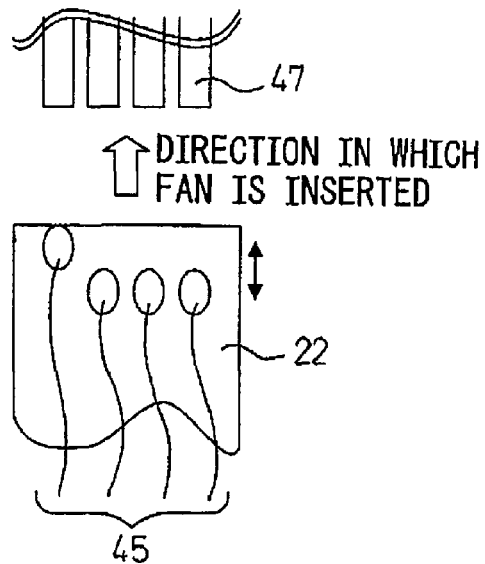
FIG. 10C is an enlarged, fragmentary plane view of a portion indicated by the reference character A in FIG. 10B.
Figure 10B:
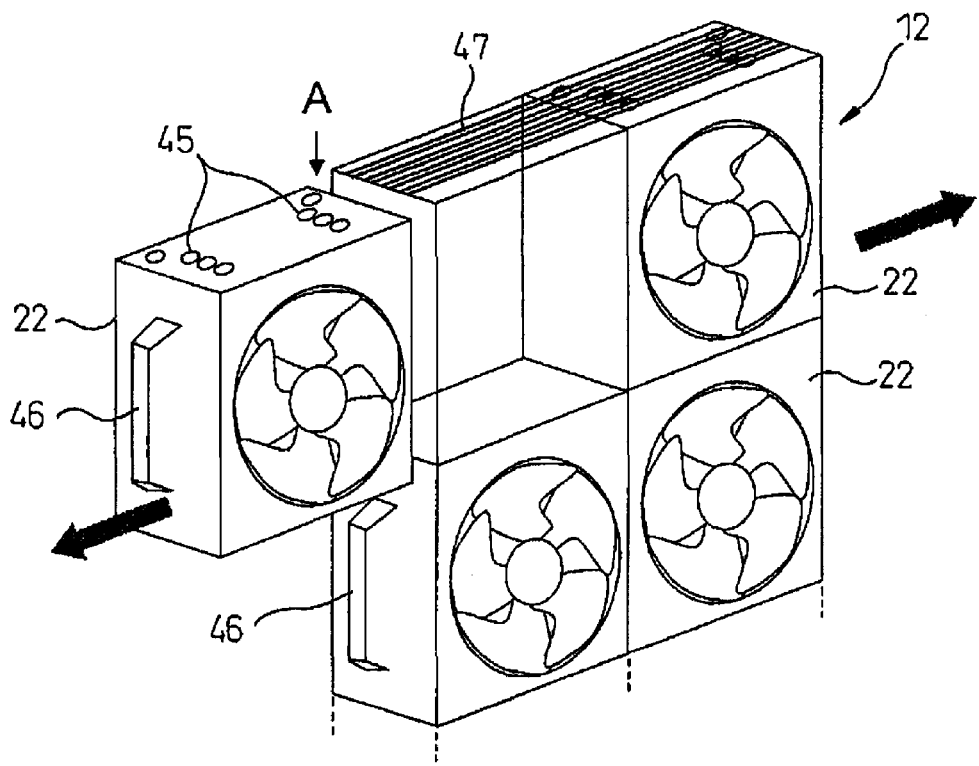
FIG. 10B is a perspective view for explaining the mechanism of withdrawing the axial-flow fans shown in FIG. 10A.

Referring to FIG. 10A, the structure of the minimum unit U, which is arranged so that the axial-flow fans 22 can be withdrawn independently and laterally from the fan units 12 for maintenance and replacement, will be described, in which the fan units 12 are used in the server-cooling system according to the invention. FIG. 10B is a perspective view for explaining the mechanism of withdrawing the axial-flow fans 22 shown in FIG. 10A. Each axial-flow fan 22 has a handle 46 provided on an exterior side face. Each fan unit 12 is provided with rails 47 for sliding the axial-flow fan 22. Incidentally, four rails are provided in this example. On the top face of each axial-flow fan 22, electrodes 45 are provided at the places corresponding to the rails 47; the axial-flow fan 22 is driven and controlled by contact of the electrodes 45 with the rails 47. FIG. 10C shows a portion indicated by the arrow A in FIG. 10B in enlarged view. This structure allows the axial-flow fans 22 to be removed from and attached to the fan units 12 without using a tool.

Figure 11A:
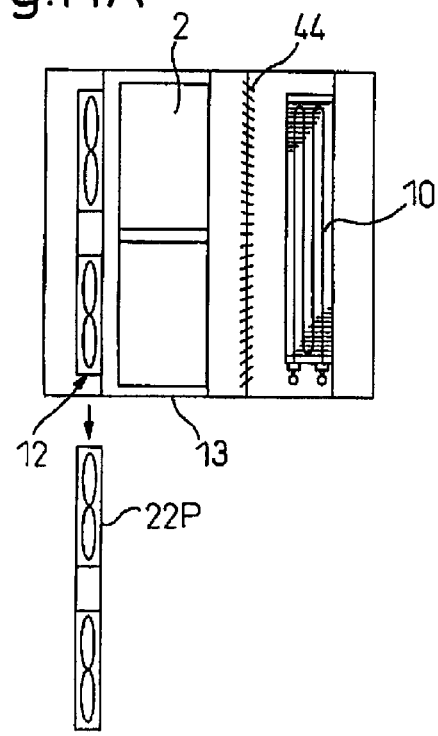
FIG. 11A is a perspective view showing the situation where the axial-flow fans of the fan units 12 have been withdrawn in pairs along one direction, provided that one pair of the axial-flow fans is arranged in each stage.
Figure 11B:
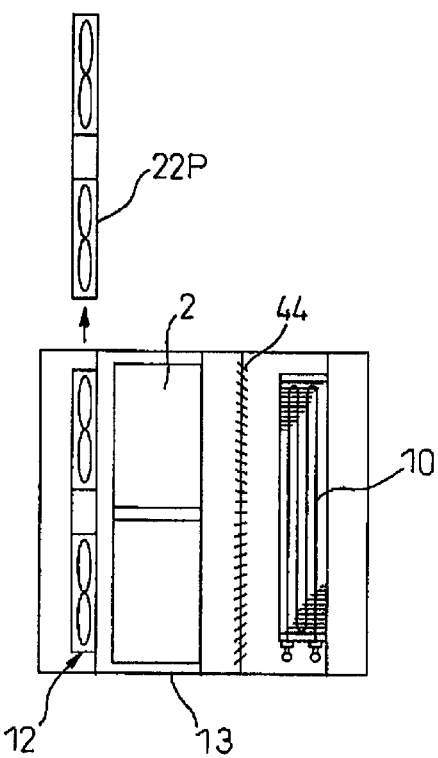
FIG. 11B is a perspective view showing the situation where the axial-flow fans of the fan units have been withdrawn in pairs along the other direction, provided that one pair of the axial-flow fans is arranged in each stage.
Figure 11C:
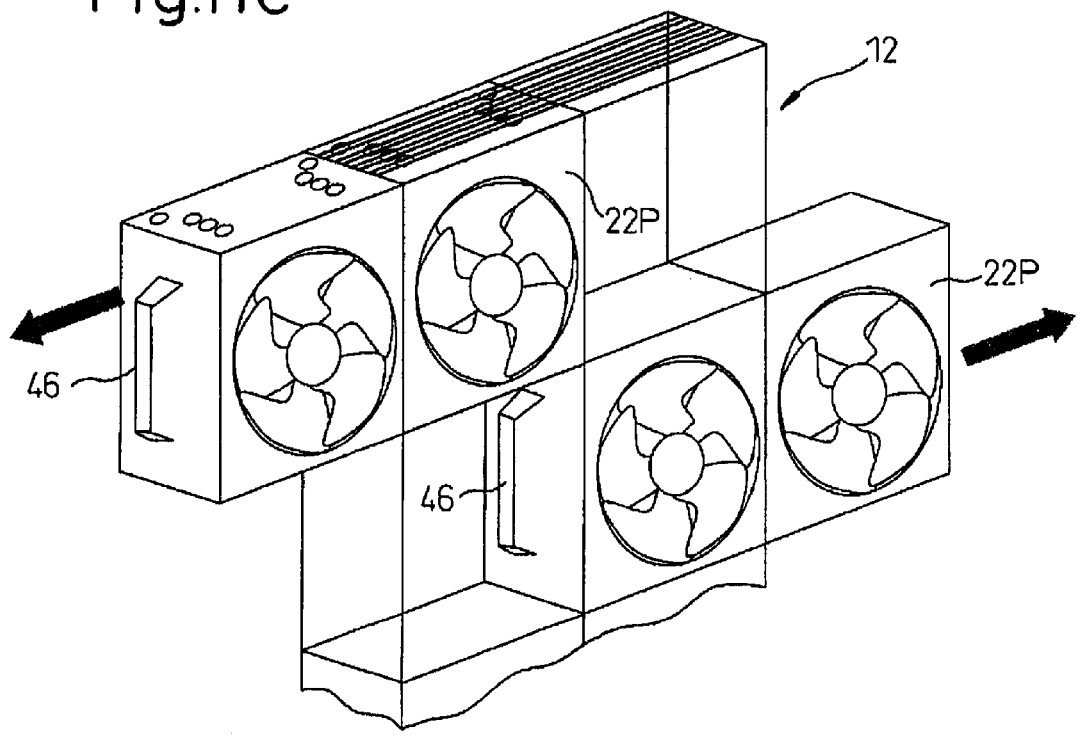
FIG. 11C is a perspective view showing that the axial-flow fans of the fan units can be withdrawn in pairs in two opposite directions, provided that one pair of the axial-flow fans is arranged in each stage.

As for the axial-flow fans 22 included in fan units 12, two axial-flow fans 22 are disposed in each stage of the fan unit 12. However, two axial-flow fans 22 of each stage can be handled as a pair of axial-flow fans 222. The arrangement like this allows the axial-flow fans 22 can be withdrawn in pairs along one direction of the fan unit 12 as shown in FIG. 11A. Also, it is possible to withdraw the axial-flow fans 22 in pairs along the other direction as shown in FIG. 11B. FIG. 11C shows the situation where the axial-flow fans 22 in the fan unit 12 are withdrawn in pairs in two opposite directions.

FIG. 12 shows a modification of the server-cooling system CS according to the invention, in which a gap, i.e. a pass-room 40, is provided in the middle of the shell 13. In the server-cooling system CS according to the invention, minimum units U are linked to one another using the shell 13. Therefore, when the number of minimum units U linked in this way is increased, the total length of the shell 13 becomes larger. As a result, to go to the opposite side of the server-cooling system CS, a person has to go around the system CS.

As a measure against this problem, in this embodiment, a pass-room 40 is provided in the middle of the shell 13, which is a gap space where none of the rack 2, cooling coil 10 and fan unit 12 are provided, and airtight doors 39 are provided in two walls of the shell 13 defining two opposite sides of the pass-room 40. As a result, when a person opens the doors 39 and passes through the pass-room, she or he can go to the opposite side of the server-cooling system CS. In a cooling-air inlet portion of the minimum unit U located in the stage subsequent to the pass-room 40, an air filter 11 is placed for removing dust entering the air-conditioned room through the doors 39.

FIG. 13 shows an embodiment in which three rows of shells 13A, 13B and 13C of server-cooling systems identical to the server-cooling system CS shown in FIG. 12 are arranged in parallel in an air-conditioned room. Each of the three rows of shells 13A, 13B and 13C may be provided with a cooling-air inlet and outlet portions. However, in this embodiment, the cooling-air outlet portion of the shell 13A and the cooling-air inlet portion of the shell 13B are closed hermetically, and the cooling-air outlet portion of the shell 13A is connected with the cooling-air inlet portion of the shell 13B through a duct 48 thermally insulated from ambient air; the cooling-air outlet portion of the shell 13B and the cooling-air inlet portion of the shell 13C are closed hermetically, and the cooling-air outlet portion of the shell 13B is connected with the cooling-air inlet portion of the shell 13C through a duct 48. In the server-cooling system CS of this embodiment, the cooling air which has entered the shell 13A through the cooling-air inlet portion of the shell 13A cools all the racks, and is discharged from the cooling-air outlet portion of the shell 13C.

FIG. 14 shows an embodiment in which two rows of shells 13A and 13B of server-cooling systems identical to the server-cooling system CS shown in FIG. 12 are arranged in parallel in an air-conditioned room. Each of the two rows of shells 13A and 13B may be provided with a cooling-air inlet and outlet portions. However, in this embodiment, all of the cooling-air inlet and outlet portions of the shell 13A and the cooling-air inlet and outlet portions of the shell 13B are closed hermetically, and the cooling-air outlet portion of the shell 13A is connected with the cooling-air inlet portion of the shell 13B through a duct 48; the cooling-air outlet portion of the shell 13B is connected with the cooling-air inlet portion of the shell 13A through a duct 48. As a result, the cooling air is circulated in a closed space constituted by the shells 13A and 13B.

FIG. 15 shows a modification of the server-cooling system CS shown in FIG. 14, in which pathways 49 having a structure like camera's bellows and thermally insulated from ambient air are provided instead of the ducts 48, whereby a closed flow path is formed. In this embodiment, the shells 13 are flexible in layout. The connecting pathway for connecting between the cooling-air outlet portion of one shell and the cooling-air inlet portion of the other shell is not limited to the ducts 48 and pathways 49 having a structure like camera's bellows.

When a closed space is formed by using ducts or connection pathways having a structure like camera's bellows to connect between shells disposed in an air-conditioned room in this way, air in the air-conditioned room can be isolated from the air circulated in the linked shells, and the need for providing an air filter as a countermeasure against dust which enters the cooling system is eliminated except for a downstream side of the pass room. In addition, the cooling air circulates in the closed space, so that noise is reduced.

Figure 19A:
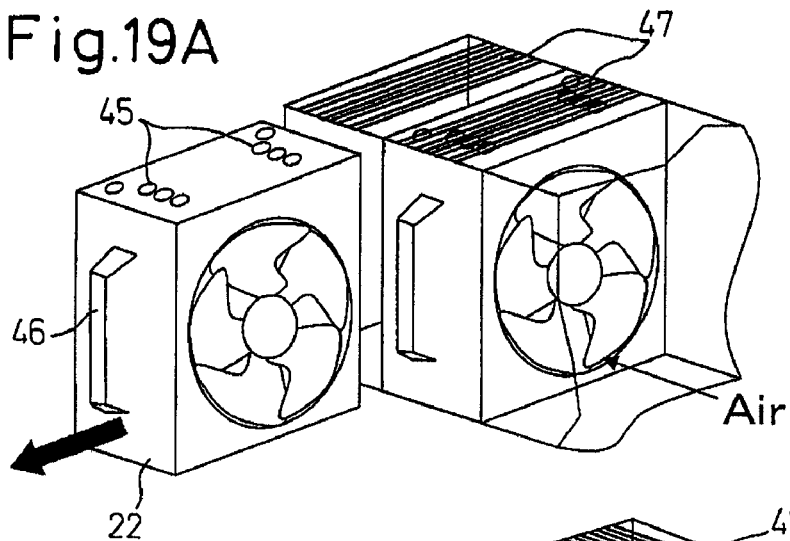
FIG. 19A is a perspective view showing a replacement mechanism for withdrawing axial-flow fans in one direction when the axial-flow fans laid out in tandem are arrayed in one row along a vertical direction.
Figure 19B:
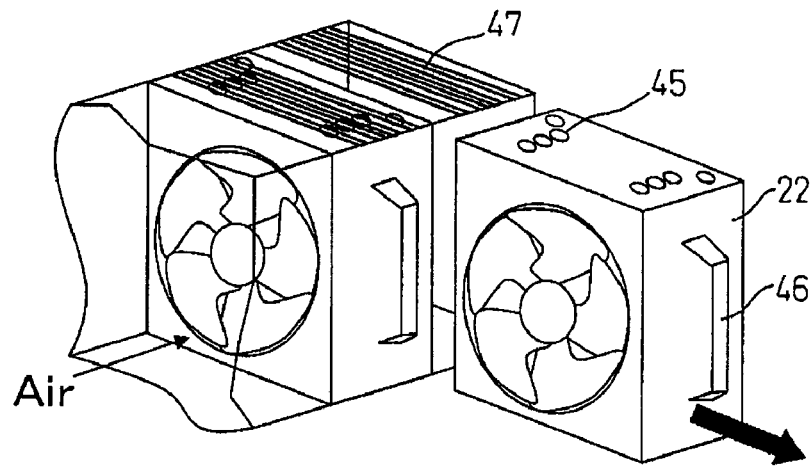
FIG. 19B is a perspective view showing a replacement mechanism for withdrawing the axial-flow fans in the other direction when the axial-flow fans laid out in tandem are arrayed in one row along the vertical direction.
Figure 19C:
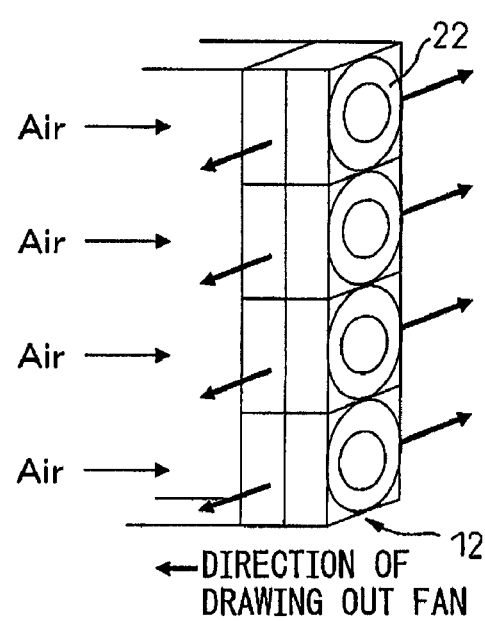
FIG. 19C is an illustration showing all of the axial-flow fans with a withdrawing mechanism.

FIG. 16A shows a structure of the minimum unit U of the server-cooling system according to the invention, in which the fan units 12 are provided in tandem. In this example, an axial-flow fan 22 and an auxiliary axial-flow fan 22 are attached in the fan units 12 in tandem and in a single row. FIG. 19A shows the situation where the axial-flow fans 22 are withdrawn in one direction individually. FIG. 19B shows the situation where the axial-flow fans 22 are withdrawn in the other direction respectively. The slide mechanism has been already described with reference to FIGS. 10A-10C, and therefore the description thereof is omitted. When the axial-flow fans 22 are arranged so that they can be withdrawn left and right by the slide mechanism as described herein, the axial-flow fans 22 can be disposed densely as shown in FIG. 19C.

FIG. 16B shows a conventional cooling system, in which four minimum units identical to the minimum unit U shown in FIG. 16A are placed in parallel in a data room 3, and a cooling air flow Q is supplied to the respective minimum units U. FIG. 16C shows a cooling system according to the invention, in which four minimum units identical to the minimum unit U shown in FIG. 16A are placed in series in a data room 3, and the cooling air flow Q is supplied form one end thereof. When comparing the conventional cooling system with the cooling system according to the invention, it is clear that the cooling system according to the invention is superior to the conventional one with regard to noise, amount of discharge, footprint, and load of air conditioning of a computer room (data room), as shown in FIG. 16D.

Figure 17C:
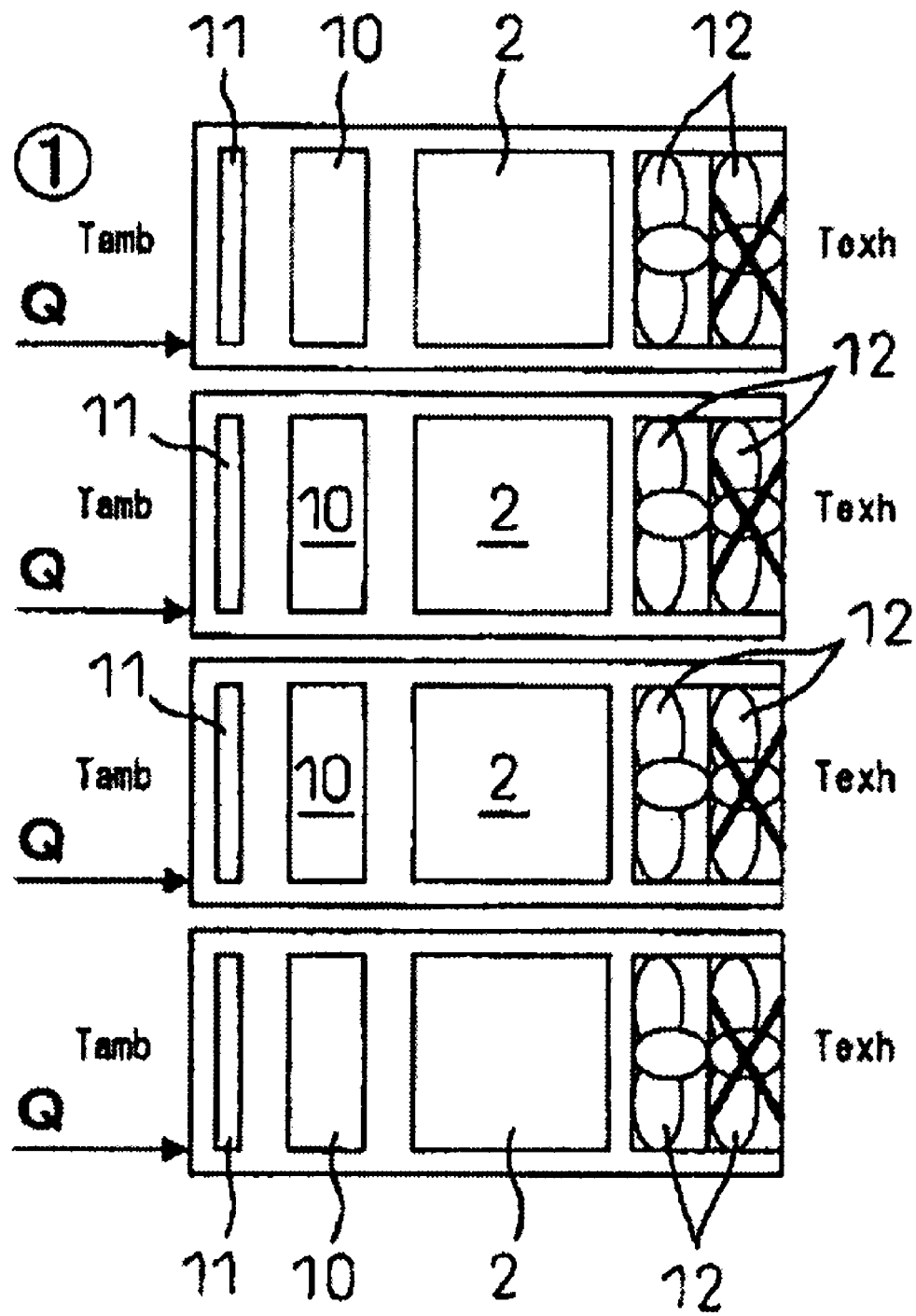
FIG. 17C is an illustration showing a server-cooling system including four minimum units connected in parallel having four minimum units identical to the minimum unit shown in FIG. 16A connected in parallel, provided that one of fan units of the final stage of each unit is faulty.

FIG. 17A shows a server-cooling system CS according to the invention having four minimum units identical to the minimum unit U shown in FIG. 16A connected in series, provided that one of fan units 12 in the final stage is at fault. FIG. 17B shows a server-cooling system CS according to the invention having a structure the same as that shown in FIG. 17A, but reduced by one in the number of fan units 12 in each minimum unit U, provided that the fan unit 12 in the final stage is at fault. FIG. 17C shows a conventional server-cooling system including four minimum units U connected in parallel having a structure the same as that shown in FIG. 16A, provided that one of fan units 12 of the final stage of each unit is at fault.

Figure 18B:
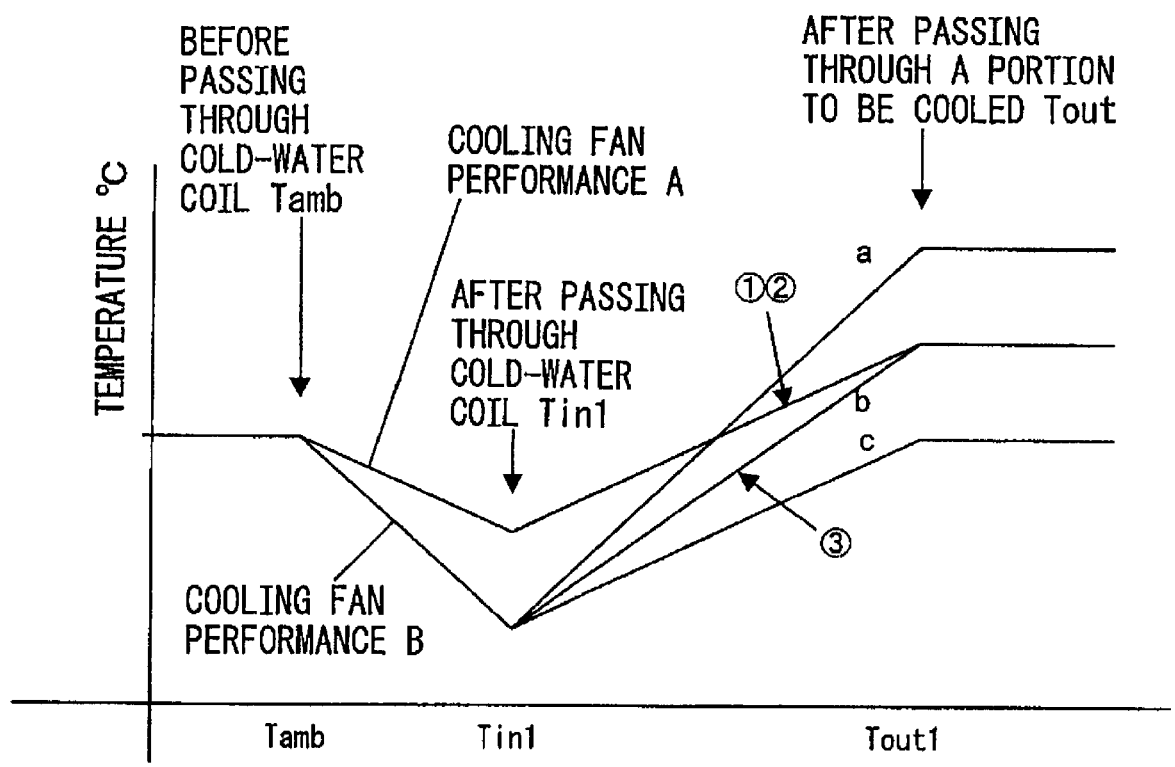
FIG. 18B is a characteristics chart showing temperature changes of cooling air after passing through the cooling coil depending on the difference in performance between the cooling fans.

FIG. 18A is a temperature distribution chart showing temperatures in the constituents of the cooling systems shown in FIGS. 17A-17C. FIG. 18B is a characteristics chart showing temperature changes of cooling air after passing through the cooling coil depending on the difference in performance between the cooling fans. FIG. 18C is a characteristics chart showing the relation among performance of the cooling fans, the pressure loss and the air low.

FIG. 17D is a table showing results of comparisons among the structures of the server-cooling systems shown in FIGS. 17A-17C in the number of the incorporated fans, the probability of the fans breaking down, the amount of discharge, electric power of the fans, and the difference in thermal treatment temperature of cold-water coils; the comparisons were made based on the characteristics shown in FIGS. 18A-18C. As is clear from the table, under the condition where the fan unit 12 of the final stage is faulty, a cooling system having the structure as shown in FIG. 17A presents the best judgment result, and after such cooling system, a cooling system having the structure as shown in FIG. 17B presents the second best judgment result. As described above, a cooling system according to the invention is superior to conventional cooling systems.

Incidentally, a removable panel for maintenance (not shown) may be put on an exterior wall face of the shell 13 for each rack 2. In such condition, when one of the mutually linked minimum units U needs to be maintained, maintenance can be performed by removing the panel for maintenance. Even in this case, maintenance has no influence on the cooling operations of other racks 2.

Also, a window which air can pass through may be selectively provided in the side, upper, and lower faces of the rack located on a upstream side of the cooling coil with respect to the cooling air. Normally, the window is closed to seal the structure. However, when the fan is stopped due to a fault or maintenance, air in an air-conditioned room can be sucked into the cooling system through the window by opening the window, whereby the air speed of air current passing through the cooling coil can be retained.

Further, as in conventional cooling systems, in order to build a cooling system having a redundant structure such that even when one of the cooling fans breaks down, the other cooling fan can perform the cooling as shown in FIG. 17C, a pair of cooling fans needs to be placed in tandem for each rack (calculation node). However, in regard to a cooling system according to the invention, cooling air flows in one direction in the shell, and therefore even when one cooling fan breaks down, cooling air still flows. Therefore, as shown in FIG. 17B, the cooling fans do not necessarily need to be placed in tandem for each rack (calculation node). As a result, the cooling system according to the invention enables a reduction in number of the cooling fans.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A cooling apparatus comprising:
a plurality of server-cooling systems and at least one connection passage are placed in an air-conditioned room, each of the plurality of server-cooling systems is connected with another of the plurality of server-cooling systems by a connection passage of the at least one connection passage;
the each of the plurality of server-cooling systems is one of:
a first type server-cooling system having a first inlet portion for entering air of the air-conditioned room and a first outlet portion for exhausting the air through the connection passage;
a second type server-cooling system having a second inlet portion for entering the air from the connection passage and a second outlet portion for exhausting the air into the air-conditioned room; and
a third type server-cooling system having a third inlet portion for entering the air from a first one of the connection passage and a third outlet portion for exhausting the air through a second one of the connection passage;
the plurality of server-cooling systems comprises the first type server-cooling system and at least one of the second type server-cooling system or the third type server-cooling system;
the each of the plurality of server-cooling systems comprising a plurality of minimum units, respectively;
each of the plurality of minimum units comprising
a rack having a plurality of cases, each of the plurality of cases housing boards, the plurality of cases are stacked,
a cooling coil having a coolant passage and a cooling fin, and the cooling coil is capable of cooling the air,
a fan unit having at least one axial-flow fan for producing an air current of the air,
a shell for placing the rack, the cooling coil and the fan unit therein and having a ventilation passage, and
seal members provided between the shell and each of the cooling coil and the fan unit,
each of the rack, the cooling coil and the fan unit are arranged in the shell so as to align towards a direction of the air current, and
the shell of a first one of the plurality of minimum units is connected to the shell of an adjacent one of the plurality of minimum units; and
a first air filter provided at the first inlet portion for filtering the air of the air-conditioned room.

2. The server-cooling system of claim 1, wherein the cooling coil is made of a dry coil by which no condensation is caused on the coolant passage and the cooling fin when a temperature of a coolant supplied into the coolant passage is controlled.

3. The server-cooling system of claim 2, wherein a temperature and a humidity of the air flowing into each rack of the rack, and the temperature of the coolant flowing into the cooling coil disposed upstream of the each rack are monitored, and
when the temperature of the coolant reaches a vicinity of a condensation point temperature where condensation is formed on the cooling coil, a control for narrowing an aperture of an electromagnetic valve provided in an inlet portion of the coolant passage of the cooling coil is performed.

4. The server-cooling system of claim 3, wherein the temperature and the humidity of the air flowing into the each rack are monitored, and
when a relative humidity of the air flowing into the each rack calculated from the temperature and the humidity exceeds a specified value based on the control for narrowing the aperture of the electromagnetic valve for raising the coolant temperature, an abnormal process including stopping a system of a server of the each rack and cutting off power supply to the server is taken.

5. The server-cooling system of claim 2, wherein a temperature and a humidity of the cooling air flowing into each rack of the rack, and the temperature of the coolant flowing into the cooling coil disposed upstream of the each rack are monitored, and
when the temperature of the coolant reaches a vicinity of a condensation point temperature where condensation is caused on the cooling coil, a control for raising the temperature of the coolant is performed by a heating means provided in a stage located precedent to an inlet portion of the coolant passage of the cooling coil.

6. The server-cooling system of claim 1, further comprising:
a gap portion provided between the shell of the first one of the plurality of minimum units and the shell of the adjacent one of the plurality of minimum units, the gap portion having a gap shell, in which none of the rack, the cooling coil, and the fan unit are placed, and
doors provided in two walls of the gap shell opposed to each other wherein a second air filter is provided at the each of the plurality of minimum units placed adjacent to a downstream side of the gap portion.

7. The server-cooling system of claim 1, wherein a rectification device for rectifying the air so that the air having passed through the cooling coil impinges on the rack evenly is provided between the cooling coil and the rack.

8. The server-cooling system of claim 7, wherein the rectification device is the cooling fin provided on the cooling coil.

9. The server-cooling system of claim 1, wherein the fan unit has a fan frame for holding the at least one axial-flow fan so that each of the at least one axial-flow fan can be inserted into and withdrawn from the fan frame respectively,
the fan frame has a set of rails along which the each of the at least one axial-flow fan can be slid independently,
the each at least one of the axial-flow fan is provided with electrodes to be connected with the set of rails, and
the each of the at least one axial-flow fan receives a power supply thereto and a signal for controlling the each of the at least one axial-flow fan through the electrodes.

10. The server-cooling system of claim 1, wherein the shell further comprises a removable panel for maintenance placed on a side face of the shell for maintaining the rack.

11. The server-cooling system of claim 1, wherein the fan unit comprises two axial flow fans of the at least one axial-flow fan connected in tandem along the direction of the air current.

12. The cooling apparatus of claim 1, wherein the cooling apparatus comprises the first type server-cooling system and the second type server-cooling system, and is formed by connecting the second type server-cooling system to the first type server-cooling system by the connection passage.

13. The cooling apparatus of claim 1, wherein the third type server-cooling system comprises a plurality of third type server-cooling systems each connected to the another of the server-cooling systems by at least one of first one of the connection passage or the second one of the connection passage.

14. The cooling apparatus of claim 1, wherein the cooling apparatus comprises the first type server-cooling system, the second type server-cooling system and the third type server-cooling system, and is formed by connecting the third type server-cooling system between the first type server-cooling system and the second server-cooling system.

* * * * *